(12) United States Patent
Shinohara et al.

(10) Patent No.: US 12,328,928 B2
(45) Date of Patent: Jun. 10, 2025

(54) SEMICONDUCTOR ELEMENT UNIT AND METHOD OF MANUFACTURING THEREOF, SEMICONDUCTOR ELEMENT UNIT SUPPLY SUBSTRATE, AND SEMICONDUCTOR PACKAGING CIRCUIT AND METHOD OF MANUFACTURING THEREOF

(71) Applicant: Oki Electric Industry Co., Ltd., Tokyo (JP)

(72) Inventors: Yuuki Shinohara, Tokyo (JP); Takahito Suzuki, Tokyo (JP); Kenichi Tanigawa, Tokyo (JP); Hironori Furuta, Tokyo (JP); Toru Kosaka, Tokyo (JP); Yusuke Nakai, Tokyo (JP); Shinya Jyumonji, Tokyo (JP); Genichirou Matsuo, Tokyo (JP); Takuma Ishikawa, Tokyo (JP); Chihiro Takahashi, Tokyo (JP); Hiroto Kawada, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 290 days.

(21) Appl. No.: 17/556,450

(22) Filed: Dec. 20, 2021

(65) Prior Publication Data
US 2022/0310817 A1 Sep. 29, 2022

(30) Foreign Application Priority Data
Mar. 29, 2021 (JP) .................. 2021-055531

(51) Int. Cl.
*H05K 1/18* (2006.01)
*H05K 3/30* (2006.01)
(Continued)

(52) U.S. Cl.
CPC ............. *H10D 64/62* (2025.01); *H05K 1/181* (2013.01); *H05K 3/303* (2013.01); *H10D 64/01* (2025.01);
(Continued)

(58) Field of Classification Search
CPC ........ H01G 29/401; H05K 1/181; H05K 3/303
(Continued)

(56) References Cited

U.S. PATENT DOCUMENTS

2006/0231837 A1* 10/2006 Wuchse ............... H10K 59/179
257/59
2008/0230926 A1* 9/2008 Dijkstra ............ H01L 23/49582
438/758
(Continued)

FOREIGN PATENT DOCUMENTS

EP 1658642 B1 2/2014
JP S5469981 A 6/1979
(Continued)

*Primary Examiner* — Stanley Tso
(74) *Attorney, Agent, or Firm* — Rabin & Berdo, P.C.

(57) ABSTRACT

A semiconductor element unit includes a semiconductor element; and a first electrode having a flat first electrode mounting surface whose surface roughness is less than or equal to 10 [nm] and forming eutectic bonding with the semiconductor element in a part different from the first electrode mounting surface. A semiconductor element unit supply substrate includes one or more semiconductor element units. A semiconductor packaging circuit includes the semiconductor element unit.

11 Claims, 16 Drawing Sheets

(51) Int. Cl.
*H10D 64/01* (2025.01)
*H10D 64/62* (2025.01)
*H01L 23/00* (2006.01)

(52) U.S. Cl.
CPC .............. *H01L 24/27* (2013.01); *H01L 24/29* (2013.01); *H01L 24/32* (2013.01); *H01L 24/83* (2013.01); *H01L 2224/32227* (2013.01)

(58) Field of Classification Search
USPC ........................................................ 174/669
See application file for complete search history.

(56) References Cited

U.S. PATENT DOCUMENTS

2012/0098021 A1    4/2012  Chan et al.
2013/0126926 A1*  5/2013  Sakai ...................... H01L 33/50
                                                                                                    257/98
2019/0229097 A1    7/2019  Takeya et al.
2019/0324577 A1  10/2019  Pan
2020/0266320 A1   8/2020  Sakai et al.
2022/0330447 A1*  10/2022  Konishi ............... H05K 7/1427

FOREIGN PATENT DOCUMENTS

| | | |
|---|---|---|
| JP | S649616 A | 1/1989 |
| JP | 2001028459 A | 1/2001 |
| JP | 2010165754 A | 7/2010 |
| JP | 2013074171 A | 4/2013 |
| JP | 2013-219374 A | 10/2013 |
| JP | 2019091738 A | 6/2019 |

* cited by examiner

FIG. 2A
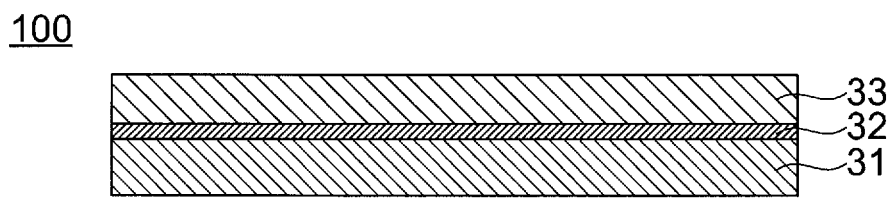
FIG. 2B
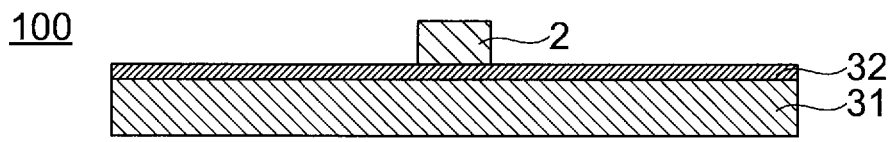
FIG. 2C
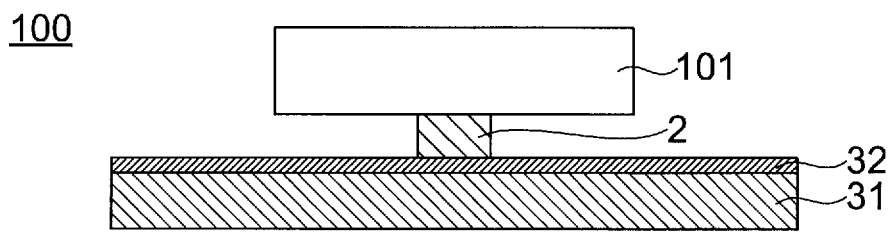
FIG. 2D
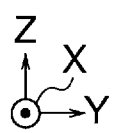

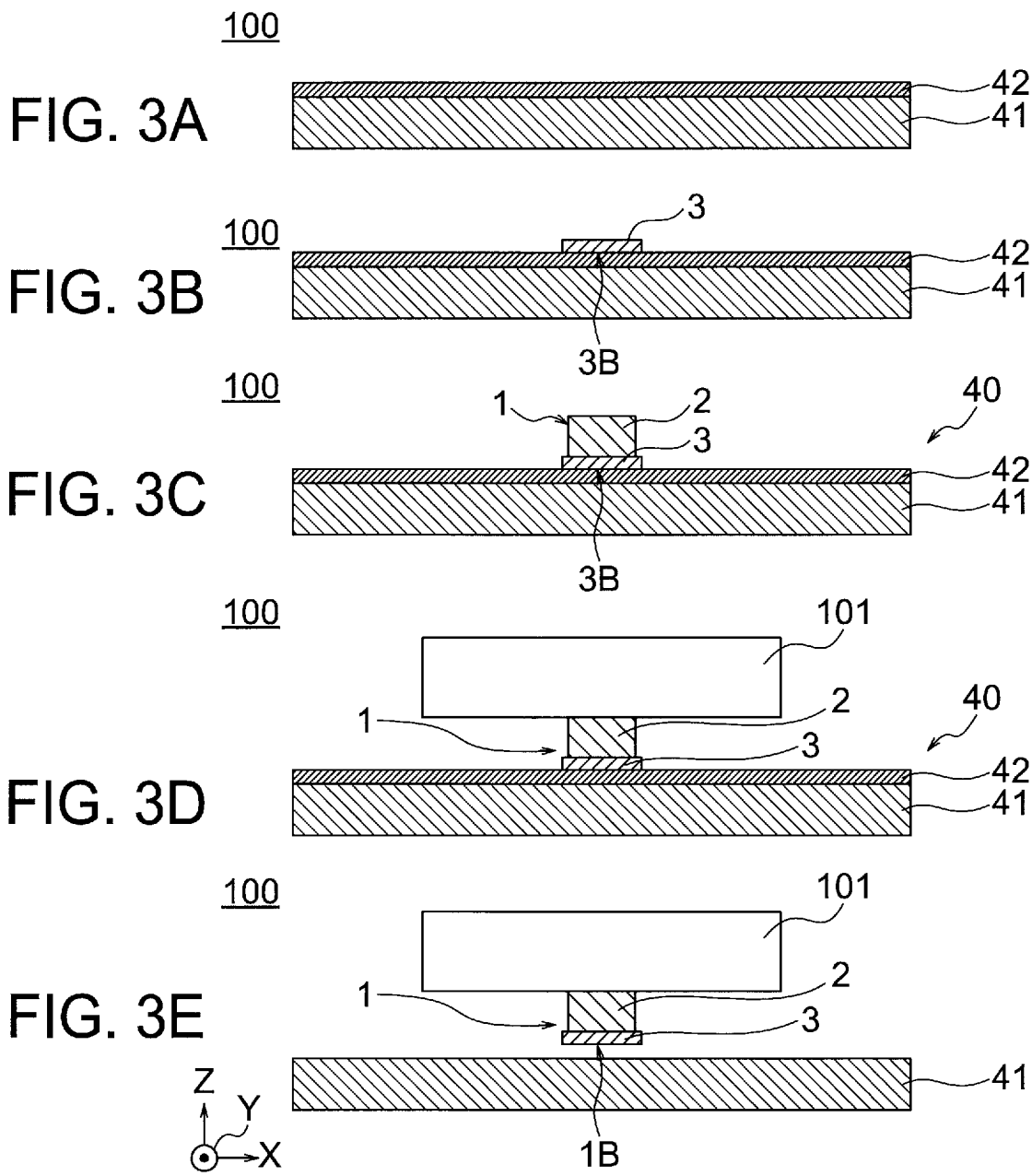

FIG. 9A
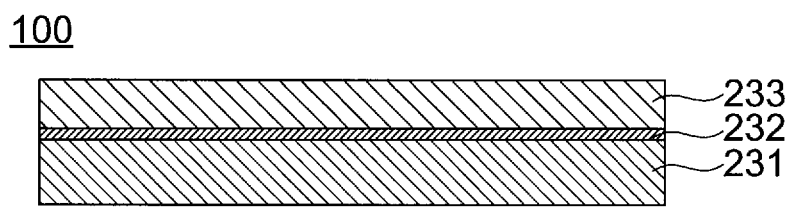
FIG. 9B
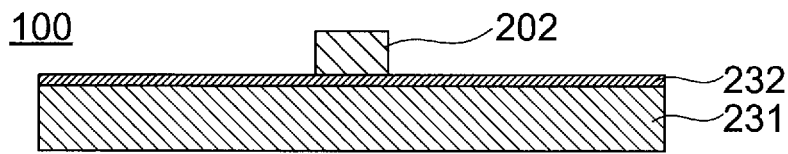
FIG. 9C
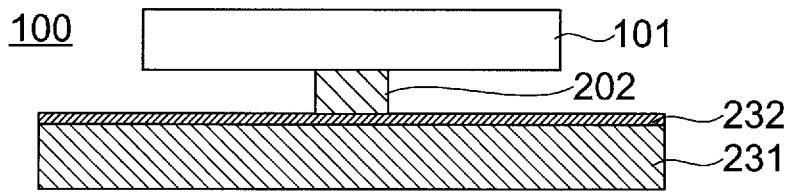
FIG. 9D
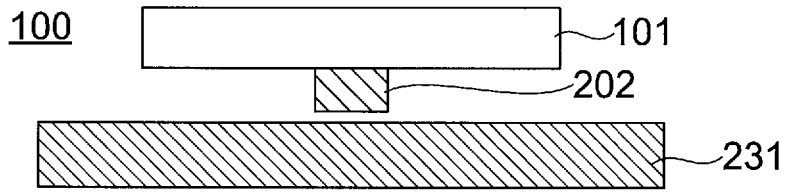
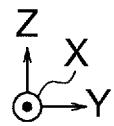

SEMICONDUCTOR ELEMENT UNIT AND METHOD OF MANUFACTURING THEREOF, SEMICONDUCTOR ELEMENT UNIT SUPPLY SUBSTRATE, AND SEMICONDUCTOR PACKAGING CIRCUIT AND METHOD OF MANUFACTURING THEREOF

BACKGROUND OF THE INVENTION

1. Field of the Invention

The present disclosure relates to a semiconductor element unit and a method of manufacturing thereof, a semiconductor element unit supply substrate, and a semiconductor packaging circuit and a method of manufacturing thereof.

2. Description of the Related Art

In recent years, as a semiconductor device with a semiconductor element mounted thereon, there has been proposed a semiconductor device of the so-called vertical structure type, designed to form electrical connection (i.e., establish conduction) between a lower surface of the semiconductor element and a circuit board, in order to downsize the semiconductor element and increase the degree of integration of the semiconductor elements.

For example, as the semiconductor device, there has been proposed a semiconductor device in which a cathode surface of the semiconductor element is pointed downward (towards the circuit board's side) and exposed and the cathode surface is stuck on a terminal part provided on a drive circuit board. See Japanese Patent Application Publication No. 2013-219374 (e.g., FIG. 3), for example. In this semiconductor device, an anode surface and a drive circuit are electrically connected to each other by exposing the anode surface upward and forming wiring between the anode surface and the drive circuit, for example.

In regard to the above-described semiconductor element, it can be considered to allow the electrical connection between the semiconductor element and the drive circuit board to be reliable and easy by providing an electrode on the cathode surface and placing the electrode in contact with the terminal part of the drive circuit board. Further, in this case, it can also be considered to excellently form electrical connection (so-called conduction) between the electrode and the terminal part by forming both of a contact surface of the electrode and a contact surface of the terminal part to be extremely smooth.

Incidentally, on a semiconductor element, it is difficult to excellently form the conduction between the semiconductor element and an electrode or the like just by placing the material forming the semiconductor element and the material forming the electrode or the like in contact with each other since ohmic contact is not formed between these two materials. Thus, when attaching an electrode to a semiconductor element, for example, it is possible to execute the so-called annealing process in which the electrode and the semiconductor element in contact with each other is placed in an environment at high temperature (e.g., approximately 600 [° C.]). When the annealing process is executed appropriately, the semiconductor element forms eutectic bonding with the electrode and reaches a state of the so-called ohmic contact, and thus the degree of contact increases and the conduction to the electrode can be formed excellently.

However, suppose that the annealing process is executed in a state in which the electrode is in contact with the semiconductor element and the contact surface of the electrode is exposed, smoothness of the contact surface deteriorates significantly due to influence of heat, and thus there is a possibility that the contact with the terminal part of the drive circuit board deteriorates and securing excellent conduction becomes impossible. Further, suppose that the annealing process is executed for the semiconductor element, the electrode and the drive circuit board in a state in which the electrode is in contact with the semiconductor element and also in contact with the terminal part of the drive circuit board, there is a danger of damaging the drive circuit board due to high temperature even though the smoothness of the contact surface can be maintained.

To sum up, there is a problem in that it is not easy to make the semiconductor element be in ohmic contact with the electrode while also making the contact surface of the electrode be flat.

SUMMARY OF THE INVENTION

An object of the present disclosure is to provide a semiconductor element unit, a method of manufacturing a semiconductor element unit, a semiconductor element unit supply substrate, a semiconductor packaging circuit, and a method of manufacturing a semiconductor packaging circuit capable of realizing excellent electrical connection between a semiconductor and a circuit while realizing a small-sized configuration.

A semiconductor element unit of the present disclosure includes: a semiconductor element; and a first electrode having a flat first electrode mounting surface whose surface roughness is less than or equal to 10 [nm] and forming eutectic bonding with the semiconductor element in a part different from the first electrode mounting surface.

A method of manufacturing a semiconductor element unit of the present disclosure, includes: forming a formation sacrificial layer on a formation substrate; forming a first electrode on the formation sacrificial layer; transferring a semiconductor element onto the first electrode; and causing eutectic bonding between the semiconductor element and the first electrode by an annealing process.

A semiconductor element unit supply substrate of the present disclosure, includes: the one or more semiconductor element units; and a substrate having a flat substrate surface, wherein the one or more semiconductor element units are stuck on the substrate in a state of being in contact with the substrate surface.

A semiconductor packaging circuit of the present disclosure, includes: the semiconductor element unit; a circuit board whose substrate surface is formed flat; a first circuit connection pad provided on the circuit board and whose first pad surface being exposed to the substrate surface is in contact with the first electrode mounting surface of the semiconductor element unit; a second circuit connection pad provided on the circuit board and having a second pad surface that is exposed to the substrate surface; an insulation part formed on a region extending from a part of the semiconductor element to a part of the second circuit connection pad via the circuit board; and a wiring part formed to be overlaid on the insulation part and electrically connecting a part of the semiconductor element not covered by the insulation part and the second circuit connection pad to each other.

A method of manufacturing a semiconductor packaging circuit of the present disclosure, includes: transferring the semiconductor element unit onto a substrate surface of a circuit board and placing the first electrode mounting surface in contact with a first pad surface as a surface of a first circuit connection pad provided on the circuit board and exposed to the substrate surface; forming a first insulation part on a region extending from a part of the semiconductor element to a part of the second circuit connection pad via the circuit board; and forming a wiring part that electrically connects a part of the semiconductor element not covered by the first insulation part and a part of the second circuit connection pad not covered by the first insulation part to each other so that the wiring part is overlaid on the first insulation part.

A semiconductor element unit of the present disclosure, includes: a semiconductor element; a first electrode having a flat first electrode mounting surface and forming eutectic bonding with the semiconductor element in a part different from the first electrode mounting surface; a second electrode provided at a position not contacting the semiconductor element or the first electrode and having a flat second electrode mounting surface; a first insulation part formed to straddle a part of the semiconductor element and a part of the second electrode; a wiring part formed to be overlaid on the first insulation part and electrically connecting a part of the semiconductor element not covered by the first insulation part and a part of the second electrode not covered by the first insulation part to each other; and a second insulation part covering the semiconductor element, the wiring part, the first insulation part and the second electrode, wherein the second electrode mounting surface is situated on a unit mounting surface that is a same plane as the first electrode mounting surface.

A method of manufacturing a semiconductor element unit of the present disclosure, includes: forming a formation sacrificial layer on a formation substrate; forming a first electrode on the formation sacrificial layer; forming a second electrode on the formation sacrificial layer; transferring a semiconductor element onto the first electrode; causing eutectic bonding between the semiconductor element and the first electrode by an annealing process; forming a first insulation part to straddle a part of the semiconductor element and a part of the second electrode; forming a wiring part that electrically connects a part of the semiconductor element not covered by the first insulation part and a part of the second electrode not covered by the first insulation part to each other so that the wiring part is overlaid on the first insulation part; and forming a second insulation part covering the semiconductor element, the wiring part, the first insulation part and the second electrode.

A semiconductor element unit supply substrate of the present disclosure, includes: the one or more semiconductor element units; and a substrate having a flat substrate surface, wherein the one or more semiconductor element units are stuck on the substrate in a state of being in contact with the substrate surface.

A semiconductor packaging circuit of the present disclosure, includes: the semiconductor element unit; a circuit board whose substrate surface is formed flat; a first circuit connection pad provided on the circuit board and whose first pad surface being exposed to the substrate surface is in contact with the first electrode mounting surface of the semiconductor element unit; and a second circuit connection pad provided on the circuit board and whose second pad surface being exposed to the substrate surface is in contact with the second electrode mounting surface of the semiconductor element unit.

BRIEF DESCRIPTION OF THE DRAWINGS

In the drawings,

FIGS. 2A to 2D are schematic cross-sectional views showing a manufacturing process (1) of the semiconductor element unit according to the first embodiment;

FIGS. 3A to 3E are schematic cross-sectional views showing a manufacturing process (2) of the semiconductor element unit according to the first embodiment;

FIGS. 9A to 9D are schematic cross-sectional views showing a manufacturing process (1) of the semiconductor element unit according to the second embodiment;

DETAILED DESCRIPTION OF THE INVENTION

Figure 1A:
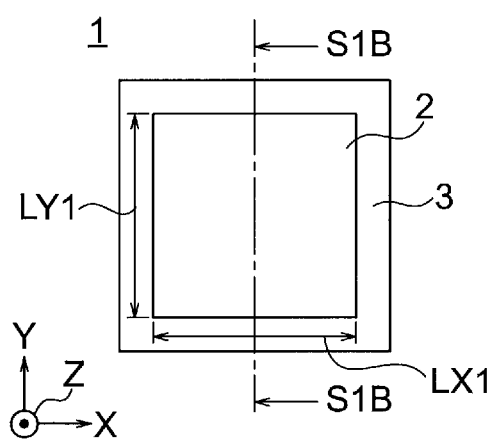
FIGS. 1A and 1B are a schematic plan view and a schematic cross-sectional view showing the configuration of a semiconductor element unit according to a first embodiment.

Modes for carrying out the invention (hereinafter referred to as "embodiments") will be described below by using the drawings. Throughout the drawings, components identical or similar to each other are assigned the same reference character.

1. First Embodiment

1-1. Configuration of Semiconductor Element Unit

Figure 1B:
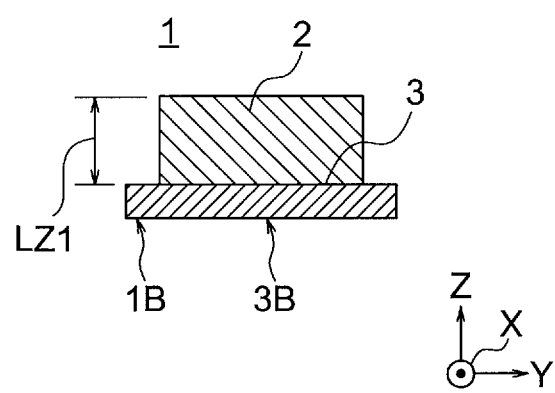

FIGS. 1A and 1B are a schematic plan view and a schematic cross-sectional view showing the configuration of a semiconductor element unit 1 according to a first embodiment. As shown in FIGS. 1A and 1B, the semiconductor element unit 1 according to the first embodiment includes a semiconductor element 2 formed in a shape like a rectangular prism and a first electrode 3 formed in a shape like a thin plate. A direction heading from the left to the right in FIG. 1A will be represented as a +X direction, a direction heading from the bottom to the top in FIG. 1A will be represented as a +Y direction, and a direction heading from the back to the front of the sheet of FIG. 1A will be represented as a +Z direction. FIG. 1B shows a cross section of the semiconductor element unit 1 of FIG. 1A sliced along the line S1B-S1B.

The semiconductor element 2 is, for example, a light-emitting element including a cladding layer of the p-type or the n-type and an active layer. On the semiconductor element 2, a surface facing the +Z direction (i.e., upper surface in FIG. 1B) is an anode and a surface facing the −Z direction (i.e., lower surface in FIG. 1B) is a cathode, for example. In the semiconductor element 2, the shorter one of a length LX1 in the X direction and a length LY1 in the Y direction is less than or equal to 200 [μm], and a length (thickness) LZ1 in the Z direction is less than or equal to 20 [μm], for example.

The first electrode 3 is made of a metallic material having electrical conductivity such as Ti, Pt or Au, or alloy of such materials, for example. On the first electrode 3, a first electrode mounting surface 3B as a surface facing the −Z direction is formed extremely flat and its surface roughness (roughness) is less than or equal to 10 [nm]. Further, the first electrode 3 is formed in a shape like a flat rectangular prism, in which a length in the X direction and a length in the Y direction are both longer and a length in the Z direction is shorter compared to those of the semiconductor element 2.

In the semiconductor element unit 1, a surface of the semiconductor element 2 facing the −Z direction and a surface of the first electrode 3 facing the +Z direction are joined to each other and eutectic bonding is formed at their joining part. Namely, in the semiconductor element unit 1, ohmic connection is realized between the semiconductor element 2 and the first electrode 3 by the eutectic bonding and specific resistance between them is less than or equal to $1.0 \times 10^{-2}$ [Ω·cm$^2$], for example. In the following description, a surface of the semiconductor element unit 1 facing the −Z direction, that is, the first electrode mounting surface 3B of the first electrode 3, will be referred to also as a unit mounting surface 1B.

1-2. Manufacture of Semiconductor Element Unit

Next, a method of manufacturing the semiconductor element unit 1 will be described below with reference to FIGS. 2A to 2D and FIGS. 3A to 3E. FIGS. 2A to 2D are schematic cross-sectional views showing a manufacturing process (1) of the semiconductor element unit 1. FIGS. 3A to 3E are schematic cross-sectional views showing a manufacturing process (2) of the semiconductor element unit 1. For convenience of the explanation, the +Z direction will be referred to also as an upward direction and the −Z direction will be referred to also as a downward direction in this description.

The semiconductor element unit 1 is manufactured stepwise by prescribed manufacturing equipment 100 by successively executing former-stage steps for forming the semiconductor element 2 and latter-stage steps for combining the semiconductor element 2 and the first electrode 3 together.

First, in the former-stage steps, the manufacturing equipment 100 forms the semiconductor element 2 according to various manufacturing processes similar to those for manufacturing generic semiconductors. Specifically, as shown in FIG. 2A, the manufacturing equipment 100 executes a step of forming a growth sacrificial layer 32 on the upper side, namely, on the +Z direction side, of a prescribed growth substrate 31 and further forming a semiconductor functional layer 33 on the upper side of the growth sacrificial layer 32.

The growth substrate 31 as the lowermost layer among these members is a silicon wafer, for example. An upper surface (surface facing the +Z direction) of the growth substrate 31 is formed extremely flat and its surface roughness is less than or equal to 10 [nm]. The growth sacrificial layer 32 is a relatively thin layer made of Si (silicon), for example. For the growth sacrificial layer 32, a material that can be removed by wet etching performed in a subsequent step has been selected. The semiconductor functional layer 33 is formed with the same material as the semiconductor element 2.

Subsequently, as shown in FIG. 2B, the manufacturing equipment 100 executes a step of forming the semiconductor element 2 on the growth sacrificial layer 32 by removing unnecessary parts from the semiconductor functional layer 33. Subsequently, as shown in FIG. 2C, the manufacturing equipment 100 executes a step of sticking a stamp 101 on a surface of the semiconductor element 2 facing the +Z direction (upper surface). The stamp 101 is a part of the manufacturing equipment 100 and is obtained by forming a material such as polydimethylsiloxane (PDMS) in a prescribed shape, for example.

Subsequently, as shown in FIG. 2D, the manufacturing equipment 100 executes a step of removing the growth sacrificial layer 32 by means of an etching process using a solution of phosphoric acid or the like. By this step, in the manufacturing equipment 100, the semiconductor element 2 reaches a state of having been stuck on the lower side of the stamp 101 and having been separated from the growth substrate 31. The manufacturing equipment 100 moves the stamp 101 to a prescribed storage area and thereby stores the semiconductor element 2 in the storage area together with the stamp 101.

Next, in the latter-stage steps, the manufacturing equipment 100 subsequently puts the semiconductor element 2 and the first electrode 3 in the combined state according to various manufacturing processes similar to those for manufacturing generic semiconductors. Specifically, first, as shown in FIG. 3A, the manufacturing equipment 100 executes a step of forming a formation sacrificial layer 42 on the upper side, i.e., on a surface facing the +Z direction, of a prescribed formation substrate 41.

The formation substrate 41 is a silicon wafer, for example, similarly to the growth substrate 31 (FIGS. 2A to 2D).

Further, similarly to the case of the growth substrate 31, a surface of the formation substrate 41 facing the +Z direction (upper surface) is formed extremely flat and its surface roughness is less than or equal to 10 [nm]. The manufacturing equipment 100 may either use the previously used growth substrate 31 directly as the formation substrate 41 or use a formation substrate 41 different from the growth substrate 31.

The formation sacrificial layer 42 is a relatively thin layer made of $Al_2O_3$ (alumina), for example. For the formation sacrificial layer 42, a material that can be removed by wet etching performed in a subsequent step has been selected similarly to the case of the growth sacrificial layer 32. Further, similarly to the case of the formation substrate 41, a surface of the formation sacrificial layer 42 facing the +Z direction (upper surface) is formed extremely flat and its surface roughness is less than or equal to 10 [nm].

Subsequently, as shown in FIG. 3B, the manufacturing equipment 100 executes a step of forming the first electrode 3 like a thin film on the surface of the formation sacrificial layer 42 facing the +Z direction (upper surface). The first electrode 3 is formed with a metallic material such as Al or Ti, for example. Further, in the first electrode 3, the lengths in the X direction and the Y direction are both longer and the length in the Z direction (i.e., thickness) is shorter compared to those of the semiconductor element 2 manufactured in the former-stage steps. Furthermore, the first electrode mounting surface 3B as the surface of the first electrode 3 facing the −Z direction (lower surface) is formed extremely flat and its surface roughness is less than or equal to 10 [nm] due to influence of the surfaces of the formation substrate 41 and the formation sacrificial layer 42 facing the +Z direction (upper surfaces).

Subsequently, as shown in FIG. 3C, the manufacturing equipment 100 executes a step of transferring the semiconductor element 2 manufactured in the former-stage steps onto the surface of the first electrode 3 facing the +Z direction (upper surface). Specifically, the manufacturing equipment 100 transfers the semiconductor element 2 onto the surface of the first electrode 3 facing the +Z direction (upper surface) by, for example, moving the stamp 101, on which the semiconductor element 2 has been stuck, from the prescribed storage area to a position in the +Z direction from (above) the first electrode 3 and moving the stamp 101 in the −Z direction (downward), that is, lowering the stamp 101. Thereafter, the manufacturing equipment 100 moves the stamp 101 alone in the +Z direction (upward), that is, elevates the stamp 101 alone, and thereby separates the stamp 101 from the semiconductor element 2, and then returns the stamp 101 to the storage area.

Subsequently, as shown in FIG. 3C, the manufacturing equipment 100 executes a step of an annealing process by placing the first electrode 3 and the semiconductor element 2, in the state in which the semiconductor element 2 is in contact with the surface of the first electrode 3 facing the +Z direction (upper surface) and the first electrode mounting surface 3B is in contact with the upper surface of the formation sacrificial layer 42, in an environment at approximately 600 [° C.], for example.

In the annealing process, the semiconductor element 2 and the first electrode 3 form the eutectic bonding in the part where they are joined to each other, and consequently, the semiconductor element unit 1 is completed. At that time, the first electrode mounting surface 3B is in the state of being in contact with the upper surface of the formation sacrificial layer 42, and thus does not become rough even after the annealing process and maintains the extremely flat state.

For convenience of the explanation, the formation substrate 41 and the formation sacrificial layer 42 in the state in which the completed semiconductor element unit 1 has been set on the formation sacrificial layer 42, that is, in the state in which the first electrode mounting surface 3B is in contact with the upper surface of the formation sacrificial layer 42, will hereinafter be referred to as a supply substrate 40 or a semiconductor element unit supply substrate. Further, in the following description, the formation substrate 41 and the formation sacrificial layer 42 will also be referred to simply as a substrate, and the surface of the substrate, that is, the surface of the formation sacrificial layer 42 facing the +Z direction, will be referred to also as a substrate surface.

The supply substrate 40 has a configuration with which the semiconductor element unit 1 can be conveyed stably in cases like when the manufacturer of the semiconductor element unit 1 and the other manufacturer that mounts the semiconductor element unit 1 on a prescribed circuit board are different from each other and the semiconductor element unit 1 has to be supplied from the manufacturer to the other manufacturer, for example.

Figure 4A:
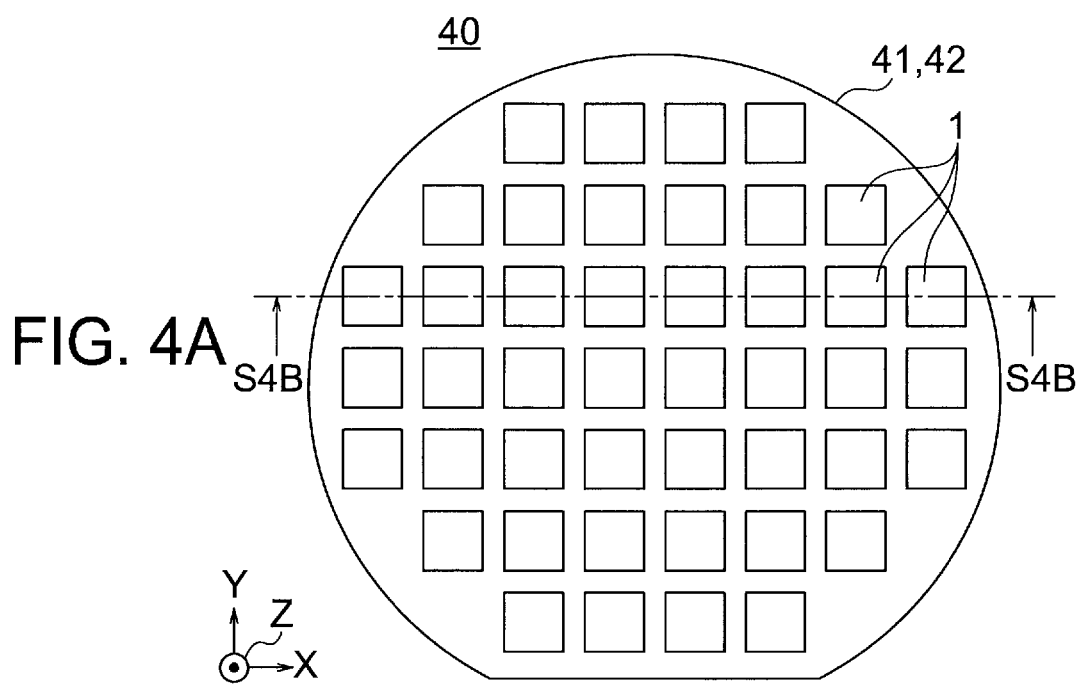
FIGS. 4A and 4B are a schematic plan view and a schematic cross-sectional view showing the configuration of a supply substrate.
Figure 4B:
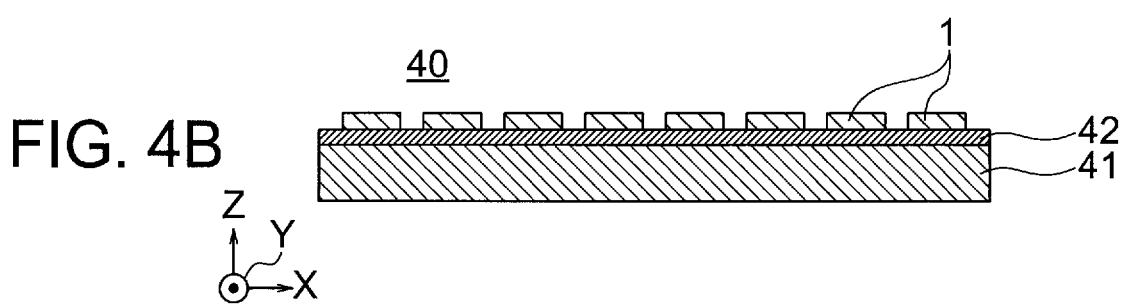

FIGS. 4A and 4B are a schematic plan view and a schematic cross-sectional view showing the configuration of the supply substrate 40. FIGS. 2A to 2D and FIGS. 3A to 3E showed the state in which the manufacturing equipment 100 manufactures one semiconductor element unit 1, that is, the state in which one semiconductor element unit 1 is included in the supply substrate 40, for convenience of the explanation. However, as shown in FIGS. 4A and 4B, for example, similarly to the manufacturing process of generic semiconductors, the actual manufacturing equipment 100 is capable of manufacturing a plurality of semiconductor element units 1 in a lump in a state in which a plurality of semiconductor element units 1 are arranged in a grid on the formation substrate 41 and the formation sacrificial layer 42, that is, in a state in which a plurality of semiconductor element units 1 are included in one supply substrate 40.

On the supply substrate 40 manufactured as above, the semiconductor element units 1 are successively moved from the positions on the formation substrate 41 and the formation sacrificial layer 42 when manufacturing a semiconductor packaging circuit which will be described later. Specifically, first, as shown in FIG. 3D, the manufacturing equipment 100 executes a step of moving the stamp 101 and sticking the surface of the semiconductor element 2 of the semiconductor element unit 1 facing the +Z direction (upper surface) on the lower surface of the stamp 101.

Subsequently, as shown in FIG. 3E, the manufacturing equipment 100 executes a step of removing the formation sacrificial layer 42 by means of an etching process using a solution of phosphoric acid or the like. By this step, in the inside of the manufacturing equipment 100, the semiconductor element unit 1 reaches a state of having been stuck on the lower side of the stamp 101 and having been separated from the formation substrate 41. In this state, the manufacturing equipment 100 is capable of moving, i.e., supplying, the semiconductor element unit 1 to a desired position by moving the stamp 101.

1-3. Configuration and Manufacture of Semiconductor Packaging Circuit

Figure 5:
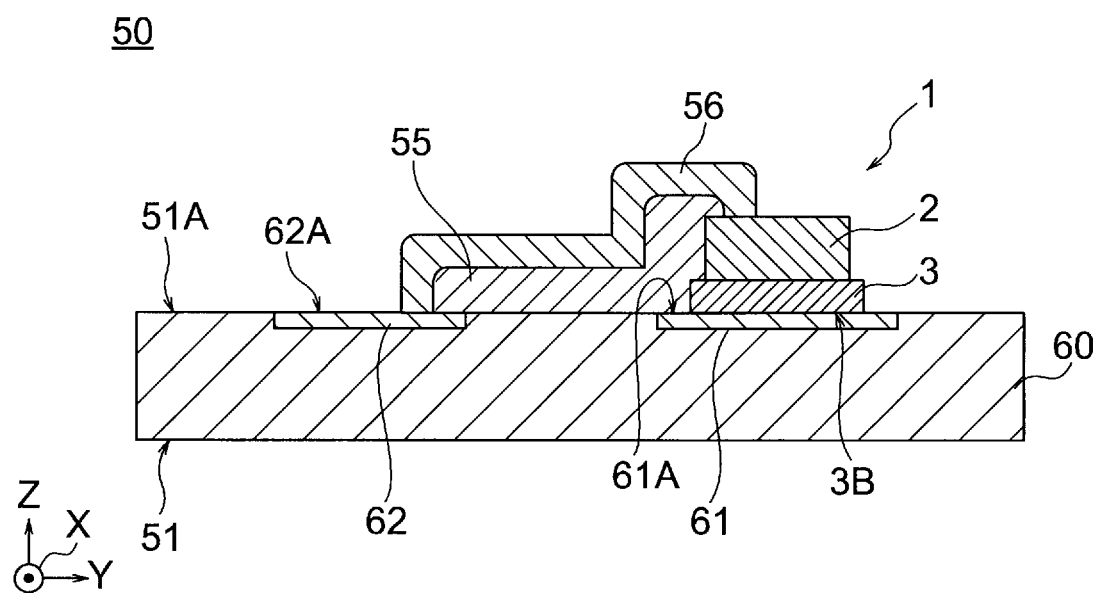
FIG. 5 is a schematic cross-sectional view showing the configuration of a semiconductor packaging circuit according to the first embodiment.

Next, a semiconductor packaging circuit 50 shown in FIG. 5 will be described below. FIG. 5 is a schematic cross-sectional view showing the configuration of the semiconductor packaging circuit 50 according to the first embodiment. The semiconductor packaging circuit 50 has a configuration in which the semiconductor element unit 1 is mounted on a circuit board 51 and is further provided with a first insulation part 55 and a wiring part 56.

The circuit board 51 includes a base member part 60, a first circuit connection pad 61 and a second circuit connection pad 62, prescribed internal wiring members and drive circuit (not shown), and so forth. The base member part 60 is formed with the so-called glass epoxy resin, that is, formed by impregnating glass fiber with epoxy resin and thermally hardening the impregnated glass fiber, for example, and has sufficient strength, insulation performance, etc.

The first circuit connection pad 61 is made of a material having electrical conductivity and exposes Al, for example, to its surface facing the +Z direction (hereinafter referred to as a "first pad surface 61A"). The first circuit connection pad 61 exposes the first pad surface 61A to a surface of the circuit board 51 facing the +Z direction (hereinafter referred to as a "substrate surface 51A"), and is electrically connected to the prescribed wiring members (not shown) inside the circuit board 51. Further, the lengths of the first circuit connection pad 61 in the X direction and the Y direction are respectively longer than the lengths of the first electrode 3 of the semiconductor element unit 1 (FIGS. 1A and 1B) in the X direction and the Y direction.

The second circuit connection pad 62 is configured similarly to the first circuit connection pad 61 and exposes its surface facing the +Z direction (hereinafter referred to as a "second pad surface 62A") to the substrate surface 51A.

Further, on the circuit board 51, the substrate surface 51A is formed in an extremely flat planar shape. Namely, on the circuit board 51, the surface of the base member part 60, the first pad surface 61A and the second pad surface 62A are all extremely flat, are planes parallel to each other, and the distance between each other in regard to the Z direction (i.e., level difference) is also extremely small.

Specifically, on the circuit board 51, the surface roughness of the substrate surface 51A, namely, the surface roughness (roughness) at the base member part 60, the first pad surface 61A and the second pad surface 62A, is less than or equal to 10 [nm].

Further, on the circuit board 51, the distances between the surface of the base member part 60 and the first pad surface 61A and between the surface of the base member part 60 and the second pad surface 62A in regard to the Z direction (i.e., level differences) are less than or equal to $1/1000$ in comparison with the shorter one of the length LX1 of the side in the X direction and the length LY1 of the side in the Y direction in the semiconductor element unit 1 (FIG. 1A).

On the substrate surface 51A of the circuit board 51, the semiconductor element unit 1 has been set on the +Z direction side of the first pad surface 61A. The semiconductor element unit 1 is arranged to fit in the range of the first circuit connection pad 61 as viewed from a position on the +Z direction side of the semiconductor element unit 1, with the first electrode mounting surface 3B facing and in contact with the first pad surface 61A.

The first insulation part 55 is a thin film formed with an organic material such as polyimide or an inorganic material such as a silicon nitride film, for example, and having insulation performance. The first insulation part 55 is provided so as to cover a range in regard to the Y direction from the vicinity of a −Y direction end of the surface of the semiconductor element 2 facing the +Z direction (i.e., upper surface) to the vicinity of a Y direction end of the second pad surface 62A.

The wiring part 56 is formed with a material having electrical conductivity such as a metal like Au, Al, Cu, Ti or Pt or a compound like ITO (Indium Tin Oxide), for example. The wiring part 56 is provided to be overlaid on the +Z direction side (i.e., upper side) of the first insulation part 55, is in contact with the surface of the semiconductor element 2 facing the +Z direction (i.e., upper surface) and the second pad surface 62A, and electrically connects them to each other.

The semiconductor packaging circuit 50 electrically connects a cathode on the −Z direction side (i.e., lower side) of the semiconductor element 2 of the semiconductor element unit 1 to the first circuit connection pad 61 while also electrically connecting an anode on the +Z direction side (i.e., upper side) of the semiconductor element 2 to the second circuit connection pad 62.

Therefore, the semiconductor packaging circuit 50 is capable of making the semiconductor element 2 as a light-emitting element emit light by applying and supplying prescribed voltage and prescribed current supplied from a non-illustrated drive circuit to the first circuit connection pad 61 and the second circuit connection pad 62.

Next, a method of manufacturing the semiconductor packaging circuit 50 will be described below with reference to FIGS. 6A to 6D. FIGS. 6A to 6D are schematic cross-sectional views showing a manufacturing process of the semiconductor packaging circuit. FIGS. 6A to 6D schematically show states in which the +Z direction is pointed in the upward direction similarly to FIGS. 2A to 2D and FIGS. 3A to 3E. For convenience of the explanation, the +Z direction will be referred to also as the upward direction and the −Z direction will be referred to also as the downward direction.

The semiconductor packaging circuit 50 is manufactured stepwise by manufacturing equipment 100 according to various manufacturing processes similar to those for manufacturing generic semiconductors. The manufacturing equipment 100 that manufactures the semiconductor packaging circuit 50 may be either the same as or different from the manufacturing equipment 100 that manufactured the semiconductor element unit 1.

Figure 6A:
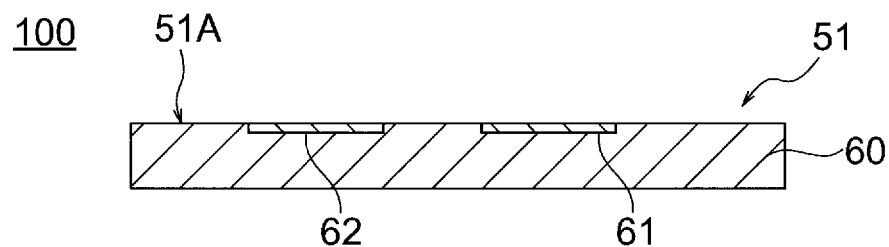
FIGS. 6A to 6D are schematic cross-sectional views showing a manufacturing process of the semiconductor packaging circuit.

First, as shown in FIG. 6A, the manufacturing equipment 100 manufactures the circuit board 51 to a state in which the first pad surface 61A and the second pad surface 62A are exposed to the surface of the base member part 60. The manufacturing equipment 100 is capable of manufacturing the circuit board 51 in a state in which the substrate surface 51A is extremely flat, that is, the base member part 60, the first pad surface 61A and the second pad surface 62A are all extremely flat and the level differences between each other are extremely small, by executing processing like chemical mechanical polishing, for example.

Figure 6B:
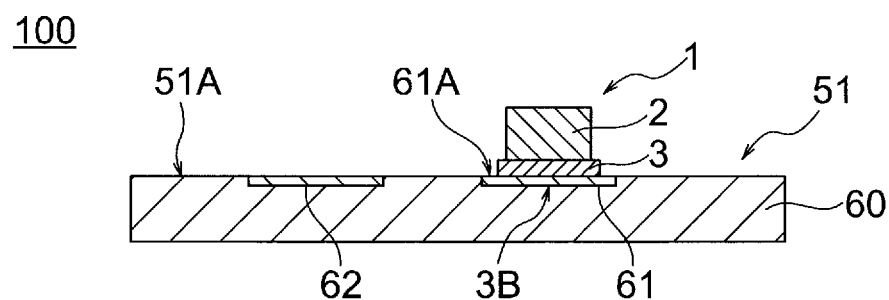

Subsequently, as shown in FIG. 6B, the manufacturing equipment 100 executes a step of transferring the semiconductor element unit 1 onto the first circuit connection pad 61 of the circuit board 51. Specifically, the manufacturing equipment 100 moves the stamp 101 on which the semiconductor element unit 1 has been stuck (FIG. 3E) to a position in the +Z direction from (i.e., above) the first circuit connection pad 61 of the circuit board 51, and further moves the stamp 101 in the −Z direction (i.e., downward), that is, lowers the stamp 101. By this step, the semiconductor element unit 1 reaches a state in which the first electrode mounting surface 3B is facing and in contact with the first pad surface 61A.

Figure 6C:
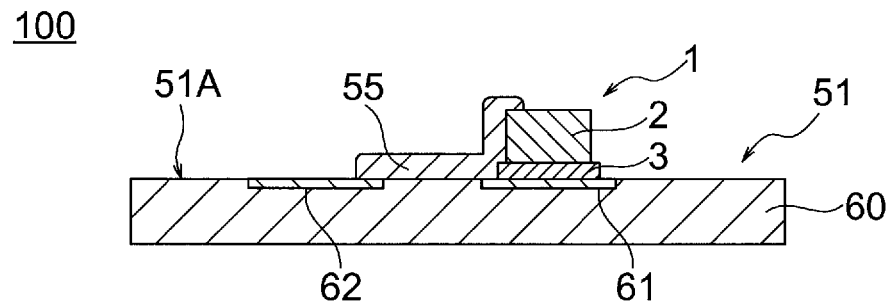

Subsequently, as shown in FIG. 6C, the manufacturing equipment 100 executes a step of forming the first insulation part 55 in a range on the circuit board 51 extending from a part of the surface of the semiconductor element 2 facing the +Z direction (upper surface) to a part of the second pad surface 62A.

Figure 6D:
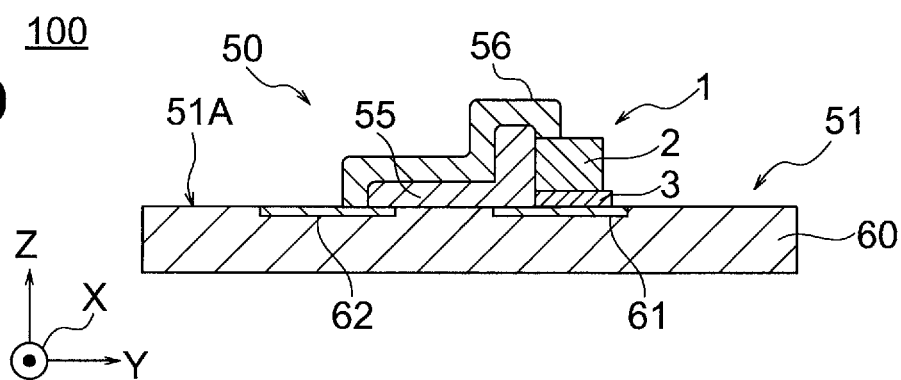

Further, as shown in FIG. 6D, the manufacturing equipment 100 executes a step of forming the wiring part 56 on the circuit board 51 so as to overlay the wiring part 56 on the +Z direction side (upper side) of the first insulation part 55. Accordingly, the wiring part 56 electrically connects the semiconductor element 2 and the second circuit connection pad 62. The manufacturing equipment 100 is capable of manufacturing the semiconductor packaging circuit 50 (FIG. 5) as described above.

1-4. Configuration of LED Display Device

Figure 7:
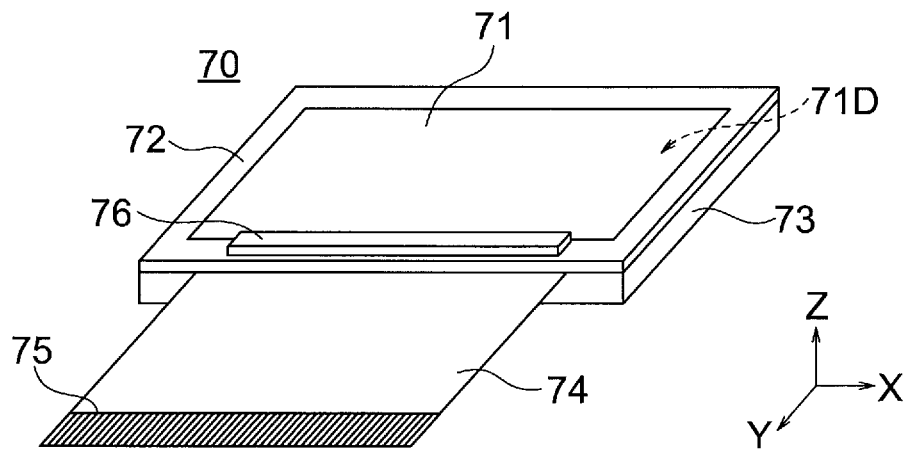
FIG. 7 is a schematic perspective view showing the configuration of an LED display device.

The semiconductor element unit 1 described earlier is referred to also as an LED (Light-Emitting Diode) element. FIG. 7 is a schematic perspective view showing the configuration of an LED display device 70. For example, a plurality of semiconductor element units 1 have been installed in the LED display device 70 shown in FIG. 7. Further, a plurality of semiconductor packaging circuits 50 have been installed in the LED display device 70.

The LED display device 70 includes an LED display type display unit 71, a frame 72, a heat radiation member 73, a connection cable 74, a connection terminal unit 75, a display driver 76, and so forth. The LED display device 70, which is referred to also as a micro-LED display, is a display in which a set of LED elements of red, green and blue is provided corresponding to one pixel.

The LED display type display unit 71 has a configuration in which a plurality of semiconductor element units 1 (FIG. 1A) are installed to be arranged like a grid in a display region that is set on a surface of a planar display circuit board 71D facing the +Z direction. The display circuit board 71D is, for example, a so-called glass epoxy substrate similar to the circuit board 51, and has a configuration like a plurality of circuit boards 51 arrayed in a grid. The frame 72 is formed in a shape like a rectangular frame with a prescribed steel material or the like, for example, and is attached to the LED display type display unit 71 to surround the outer periphery of the display region on the +Z direction side of the LED display type display unit 71.

The heat radiation member 73 is formed in a shape like a flat rectangular prism as a whole with a metallic material having relatively high thermal conductivity like aluminum, for example. The heat radiation member 73 is set to be in contact with the LED display type display unit 71 on the −Z direction side of the LED display type display unit 71, that is, on a side opposite to the surface for displaying images and the like. The connection cable 74 is electrically connected to a prescribed control device (not shown) via the connection terminal unit 75 and thereby transmits and supplies an image signal, supplied from the control device, to the display driver 76.

The display driver 76 as a drive circuit is electrically connected to the connection cable 74 and the LED display type display unit 71. For example, the display driver 76 generates drive signals of red, green and blue based on the image signal supplied via the connection cable 74 and supplies drive currents based on these drive signals to the LED display type display unit 71. Consequently, the LED display device 70 is capable of displaying an image based on the image signal supplied from the control device (not shown) or the like in the display region of the LED display type display unit 71.

1-5. Effect and Other Features

In the above-described configuration, the semiconductor element unit 1 according to the first embodiment is formed so that the surface of the semiconductor element 2 facing the −Z direction and the surface of the first electrode 3 facing the +Z direction are connected to each other by eutectic bonding and the first electrode mounting surface 3B as the surface of the first electrode 3 facing the −Z direction is maintained in the extremely flat state (FIGS. 1A and 2B).

Specifically, the manufacturing equipment 100 manufacturing the semiconductor element unit 1 forms the first electrode 3 like a thin film on the +Z direction side (upper side) of the formation sacrificial layer 42 (FIG. 3B) in the state of having been formed on the formation substrate 41, transfers the semiconductor element 2 manufactured separately (FIGS. 2A to 2D) onto the first electrode 3 (FIG. 3C), and executes the annealing process in this state. In this case, the manufacturing equipment 100 executes the annealing process while leaving the first electrode mounting surface 3B in the state of being in contact with the formation sacrificial layer 42, by which the first electrode 3 and the semiconductor element 2 can be connected to each other by eutectic bonding while maintaining the extremely flat state of the first electrode mounting surface 3B without roughening the first electrode mounting surface 3B.

Further, in the first embodiment, the substrate surface 51A of the circuit board 51 is formed extremely flat and the level differences relative to the first pad surface 61A and the second pad surface 62A are also held down to be extremely small (FIG. 5).

Therefore, when manufacturing the semiconductor packaging circuit 50 by mounting the semiconductor element unit 1 on the circuit board 51, the manufacturing equipment 100 is capable of making intermolecular force act between the first electrode mounting surface 3B and the first pad surface 61A just by transferring the semiconductor element unit 1 so as to make the first electrode mounting surface 3B contact the first pad surface 61A. By this method, in the semiconductor packaging circuit 50, the first electrode 3 of the semiconductor element unit 1 can be physically and electrically connected to the first circuit connection pad 61 of the circuit board 51.

Namely, with the semiconductor element unit 1, the semiconductor element 2 can be electrically connected excellently to the drive circuit (not shown) of the circuit board 51 just by making the first electrode mounting surface 3B contact the first pad surface 61A of the circuit board 51.

In other words, with the semiconductor element unit 1, the semiconductor element 2 and the drive circuit can be electrically connected excellently to each other without the need of executing the annealing process after the mounting on the circuit board 51, and thus damage caused to the drive circuit due to heat of the annealing process can be avoided in principle.

With the above-described configuration, in the semiconductor element unit 1 according to the first embodiment, the semiconductor element 2 and the first electrode 3 are connected to each other by eutectic bonding and the first electrode mounting surface 3B is maintained in the extremely flat state by executing the annealing process in the state in which the overlaid first electrode 3 and semiconductor element 2 have been set on the formation sacrificial layer 42. Accordingly, when the semiconductor element unit 1 is mounted on the circuit board 51 whose substrate surface 51A has been formed extremely flat, it is possible to make intermolecular force act between the first electrode mounting surface 3B and the first pad surface 61A and thereby physically and electrically connect them with each other just by transferring the semiconductor element unit 1 so as to make the first electrode mounting surface 3B contact the first pad surface 61A, and it is unnecessary to execute the annealing process after the mounting.

2. Second Embodiment

2-1. Configuration of Semiconductor Element Unit

Figure 8A:
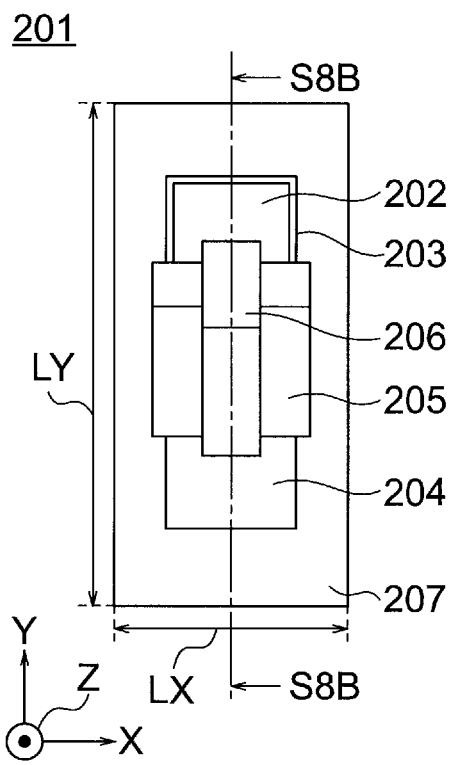
FIGS. 8A and 8B are a schematic plan view and a schematic cross-sectional view showing the configuration of a semiconductor element unit according to a second embodiment.
Figure 8B:
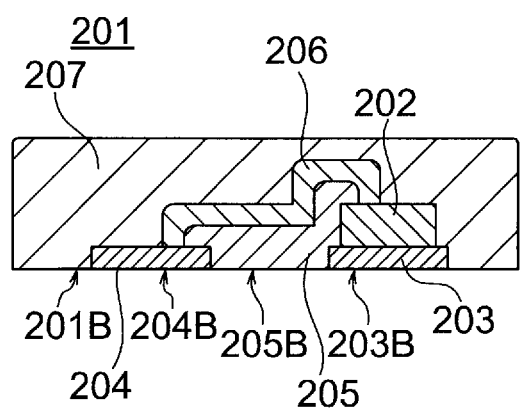

FIGS. 8A and 8B are a schematic plan view and a schematic cross-sectional view showing the configuration of a semiconductor element unit 201 according to a second embodiment. As shown in FIGS. 8A and 8B, the semiconductor element unit 201 according to the second embodiment is formed with a semiconductor element 202, a first electrode 203, a second electrode 204, a first insulation part 205, a wiring part 206 and a second insulation part 207. The semiconductor element unit 201 has a configuration similar to a part of the semiconductor packaging circuit 50 in the first embodiment (FIG. 5) that is provided on the circuit board 51.

The semiconductor element 202 is configured similarly to the semiconductor element 2 according to the first embodiment. Namely, the semiconductor element 202 is in a shape like a rectangular prism and is formed as a light-emitting element, for example. The first electrode 203 is configured similarly to the first electrode 3 according to the first embodiment, formed in a shape like a flat rectangular prism as a whole, and made of a metallic material having electrical conductivity or alloy of such materials. Further, similarly to the first embodiment, the first electrode 203 is in contact with the −Z direction side of the semiconductor element 202 and eutectic bonding is formed at their joining part. Furthermore, similarly to the first electrode mounting surface 3B according to the first embodiment, a first electrode mounting surface 203B as a surface of the first electrode 203 facing the −Z direction is formed extremely flat and its surface roughness is less than or equal to 10 [nm].

Similarly to the first electrode 203, the second electrode 204 is formed in a shape like a flat rectangular prism as a whole and made of a metallic material having electrical conductivity such as Au, Al, Cu, Ti or Pt, or alloy of such materials, for example. Similarly to the first electrode 203, on the second electrode 204, a second electrode mounting surface 204B as a surface of the second electrode 204 facing the −Z direction is formed extremely flat and its surface roughness is less than or equal to 10 [nm].

Similarly to the first insulation part 55 in the first embodiment (FIG. 5), the first insulation part 205 is a thin film formed with an organic material such as polyimide or an inorganic material such as a silicon nitride film, for example, and having insulation performance. The first insulation part 205 is provided so as to cover a range in regard to the Y direction from the vicinity of a −Y direction end of a surface of the semiconductor element 202 facing the +Z direction (i.e., upper surface) to the vicinity of a Y direction end of a surface of the second electrode 204 facing the +Z direction (i.e., upper surface).

Similarly to the wiring part 56 in the first embodiment (FIG. 5), the wiring part 206 is formed with a material having electrical conductivity such as a metal like Au, Al, Cu, Ti or Pt or a compound like ITO (Indium Tin Oxide), for example. This wiring member is provided to be overlaid on the +Z direction side (i.e., upper side) of the first insulation part 205, is in contact with the surface of the semiconductor element 202 facing the +Z direction (i.e., upper surface) and the surface of the second electrode 204 facing the +Z direction (i.e., upper surface), and electrically connects them to each other.

Similarly to the first insulation part 205, the second insulation part 207 is a thin film formed with an organic material such as polyimide or an inorganic material such as a silicon nitride film, for example, and having insulation performance. The second insulation part 207 is provided in a wide range to cover the semiconductor element 202, the first electrode 203, the second electrode 204, the first insulation part 205 and the wiring part 206 from the +Z direction side and to surround them in regard to the X direction and the Y direction. In other words, the second insulation part 207 covers the semiconductor element 202, the first electrode 203, the second electrode 204, the first insulation part 205 and the wiring part 206 from any direction except for the −Z direction side (i.e., lower side).

In the following description, the surface of the second electrode 204 facing the −Z direction will be referred to as the second electrode mounting surface 204B, and a surface of the first insulation part 205 facing the −Z direction will be referred to as a first insulation part mounting surface 205B. Further, in the following description, a surface of the semiconductor element unit 201 facing the −Z direction, that is, the first electrode mounting surface 203B, the second electrode mounting surface 204B, the first insulation part mounting surface 205B and a surface of the second insulation part 207 facing the −Z direction put together, will be referred to also as a unit mounting surface 201B. The unit mounting surface 201B is formed extremely flat as a whole and its surface roughness is less than or equal to 10 [nm]. In other words, the first insulation part 205 has a first insulation part mounting surface 205B situated on the unit mounting surface, and the second insulation part 207 has a second insulation part mounting surface 207B situated on the unit mounting surface.

Further, in the semiconductor element unit 201, the size of the level difference (i.e., length in the Z direction) at each part where different materials adjoin each other on the unit mounting surface 201B, e.g., a part where the first electrode 203 adjoins the first insulation part 205, is at a value sufficiently smaller in comparison with each side forming the external form of the unit mounting surface 201B. Specifically, in the semiconductor element unit 201, the size of the level difference is less than or equal to 1/1000 of a length (LX in the example of FIG. 8A) as the shorter one of the length LX of a side of the semiconductor element unit 201 in the X direction and the length LY of a side of the semiconductor element unit 201 in the Y direction. In other words, a size of a level difference of the unit mounting surface 201B at a part where different materials adjoin each other is less than or equal to 1/1000 of a length of a shortest side in an external form of a surface of the second insulation part 207 parallel to the unit mounting surface 201B.

2-2. Manufacture of Semiconductor Element Unit

Next, a method of manufacturing the semiconductor element unit 201 will be described below with reference to FIGS. 9A to 9D, FIGS. 10A to 10G and FIGS. 11A and 11B. FIGS. 9A to 9D, FIGS. 10A to 10G and FIGS. 11A and 11B are schematic cross-sectional views showing manufacturing processes (1) to (3) of the semiconductor element unit according to the second embodiment. FIGS. 9A to 9D, FIGS. 10A to 10G and FIGS. 11A and 11B are schematic side views or cross-sectional views showing states in which the +Z direction is pointed in the upward direction in the same way as in the first embodiment. For convenience of the explanation, the +Z direction will be referred to also as the upward direction and the −Z direction will be referred to also as the downward direction in this description.

Similarly to the semiconductor element unit 1 in the first embodiment, the semiconductor element unit 201 is manufactured stepwise by prescribed manufacturing equipment 100 by successively executing former-stage steps for forming the semiconductor element 202 and latter-stage steps for combining the semiconductor element 202 with the first electrode 203 and the like.

First, in the former-stage steps, the manufacturing equipment 100 forms the semiconductor element 202 according to various manufacturing processes similar to those for manufacturing generic semiconductors similarly to the first embodiment. Specifically, as shown in FIG. 9A corresponding to FIG. 2A, the manufacturing equipment 100 executes a step of forming a growth sacrificial layer 232 on the upper side, namely, on the +Z direction side, of a prescribed growth substrate 231 and further forming a semiconductor functional layer 233 on the upper side of the growth sacrificial layer 232. The growth substrate 231, the growth sacrificial layer 232 and the semiconductor functional layer 233 are respectively configured similarly to the growth substrate 31, the growth sacrificial layer 32 and the semiconductor functional layer 33 in the first embodiment.

Thereafter, as shown in FIGS. 9B to 9D respectively corresponding to FIGS. 2B to 2D, the manufacturing equipment 100 puts the semiconductor element 202 in a state of having been stuck on the lower side of the stamp 101 by successively executing steps of the removal of unnecessary parts, the etching process, etc.

Figure 10A:
FIGS. 10A to 10G are schematic cross-sectional views showing a manufacturing process (2) of the semiconductor element unit according to the second embodiment.

Next, in the latter-stage steps, the manufacturing equipment 100 subsequently puts the semiconductor element 202 and the first electrode 203 and the like in the combined state according to various manufacturing processes similar to those for manufacturing generic semiconductors. Specifically, first, as shown in FIG. 10A corresponding to FIG. 3A, the manufacturing equipment 100 executes a step of forming a formation sacrificial layer 242 on the upper side, i.e., the +Z direction side, of a prescribed formation substrate 241. The formation substrate 241 and the formation sacrificial layer 242 are configured similarly to the formation substrate 41 and the formation sacrificial layer 42 in the first embodiment. Namely, a surface of the formation sacrificial layer 242 facing the +Z direction (upper surface) is formed extremely flat and its surface roughness is less than or equal to 10 [nm].

Figure 10B:
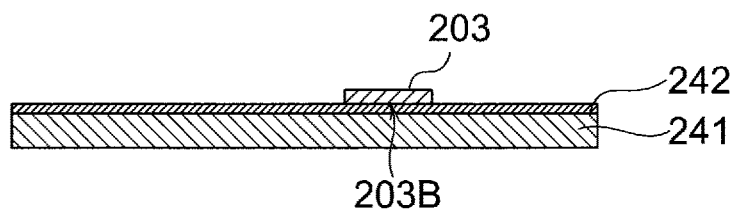

Subsequently, as shown in FIG. 10B corresponding to FIG. 3B, the manufacturing equipment 100 executes a step of forming the first electrode 203 like a thin film on the +Z direction side (upper side) of the formation sacrificial layer 242. The first electrode 203 is formed with a metallic material such as Ti or Pt, for example. At that time, the first electrode mounting surface 203B is formed extremely flat and its surface roughness is less than or equal to 10 [nm] due to the influence of the surfaces of the formation sacrificial layer 242 facing the +Z direction (upper surface).

Figure 10C:
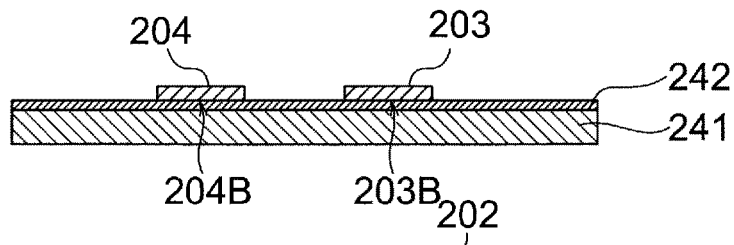

Further, as shown in FIG. 10C, the manufacturing equipment 100 executes a step of forming the second electrode 204 like a thin film on the surfaces of the formation sacrificial layer 242 facing the +Z direction (upper surface). The second electrode 204 is formed with an alloy material such as AuGeNi, for example. At that time, similarly to the first electrode mounting surface 203B, the second electrode mounting surface 204B is formed extremely flat and its surface roughness is less than or equal to 10 [nm] due to the influence of the surfaces of the formation sacrificial layer 242 facing the +Z direction (upper surface).

Figure 10D:
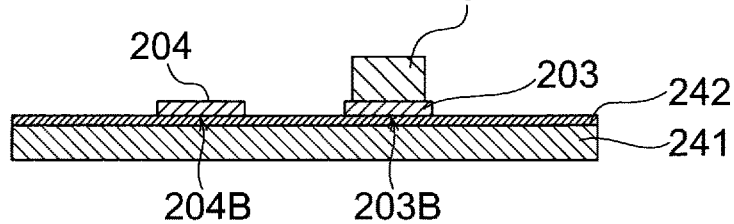

Subsequently, as shown in FIG. 10D corresponding to FIG. 3C, the manufacturing equipment 100 executes a step of transferring the semiconductor element 202 manufactured in the former-stage steps onto the surface of the first electrode 203 facing the +Z direction (upper surface). Specifically, the manufacturing equipment 100 transfers the semiconductor element 202 onto the +Z direction side (upper side) of the first electrode 203 by, for example, moving the stamp 101 (FIG. 9D), on which the semiconductor element 202 has been stuck, to a position on the +Z direction side (upper side) of the first electrode 203 and moving the stamp 101 towards the −Z direction side (lower side).

Subsequently, as shown in FIG. 10D, the manufacturing equipment 100 executes a step of the annealing process by placing the first electrode 203 and the semiconductor element 202, in the state in which the semiconductor element 202 is in contact with the +Z direction side (upper side) of the first electrode 203 and the first electrode mounting surface 203B and the second electrode mounting surface 204B are in contact with the upper surface of the formation sacrificial layer 242, in an environment at approximately 600 [° C.], for example.

In the annealing process, the semiconductor element 202 and the first electrode 203 form the eutectic bonding in the part where they are joined to each other. At that time, the first electrode mounting surface 203B and the second electrode mounting surface 204B are both in the state of being in contact with the upper surface of the formation sacrificial layer 242, and thus do not become rough even after the annealing process and maintain the extremely flat state.

Figure 10E:
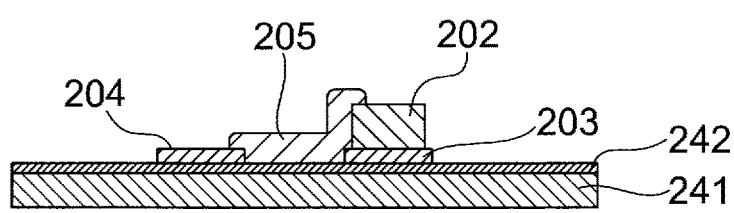

Subsequently, as shown in FIG. 10E corresponding to FIG. 6C, the manufacturing equipment 100 executes a step of forming the first insulation part 205 in a range on the formation sacrificial layer 242 extending from a part of the surface of the semiconductor element 202 facing the +Z direction (upper surface) to a part of the surface of the second electrode 204 facing the +Z direction (upper surface).

Figure 10F:
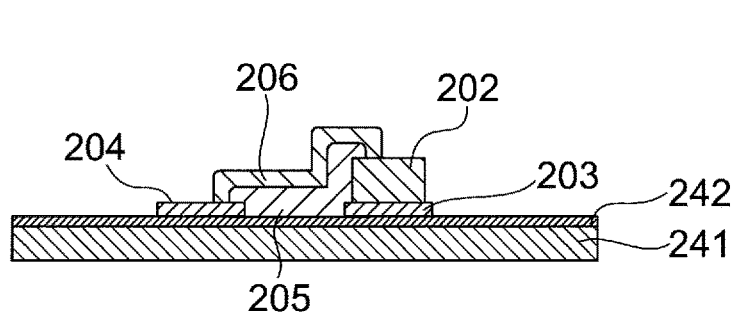

Subsequently, as shown in FIG. 10F corresponding to FIG. 6D, the manufacturing equipment 100 executes a step of forming the wiring part 206 over the circuit board 51 so as to overlay the wiring part 206 on the +Z direction side (upper side) of the first insulation part 205. Accordingly, the wiring part 206 electrically connects the surface of the semiconductor element 202 facing the +Z direction (upper surface) and the surface of the second electrode 204 facing the +Z direction (upper surface).

Figure 10G:
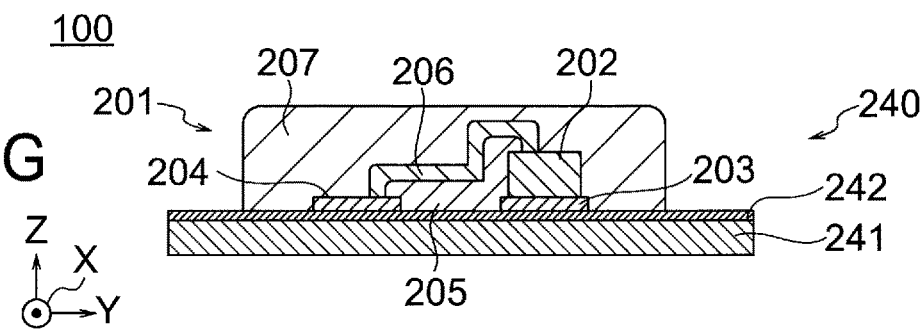

Further, as shown in FIG. 10G, the manufacturing equipment 100 executes a step of forming the second insulation part 207 on the formation sacrificial layer 242 so as to overlay the second insulation part 207 on the +Z direction side (upper side) of the semiconductor element 202, the first insulation part 205, the wiring part 206, etc. Accordingly, the second insulation part 207 covers the +Z direction side, the +X direction side, the −X direction side, the +Y direction side and the −Y direction side of the structure formed with the semiconductor element 202, the first electrode 203, the second electrode 204, the first insulation part 205 and the wiring part 206. Preferably, the second insulation part 207 covers all of top surfaces and side faces of the structure formed with the semiconductor element 202, the first electrode 203, the second electrode 204, the first insulation part 205 and the wiring part 206. Consequently, the manufacturing equipment 100 can complete the semiconductor element unit 201.

For convenience of the explanation, in the second embodiment, the formation substrate 241 and the formation sacrificial layer 242 in the state in which the completed semiconductor element unit 201 has been set on the formation sacrificial layer 242 will be referred to as a supply substrate 240 or a semiconductor element unit supply substrate. Further, in the second embodiment, the formation substrate 241 and the formation sacrificial layer 242 will also be referred to simply as a substrate, and the surface of the substrate, that is, the surface of the formation sacrificial layer 242 facing the +Z direction, will be referred to also as a substrate surface.

Further, similarly to the first embodiment (FIGS. 4A and 4B), the actual manufacturing equipment 100 is capable of manufacturing a plurality of semiconductor element units 201 in a lump in a state in which a plurality of semiconductor element units 201 are arranged on the formation substrate 241 and the formation sacrificial layer 242, that is, in a state in which a plurality of semiconductor element units 201 are included in one supply substrate 240.

Figure 11A:
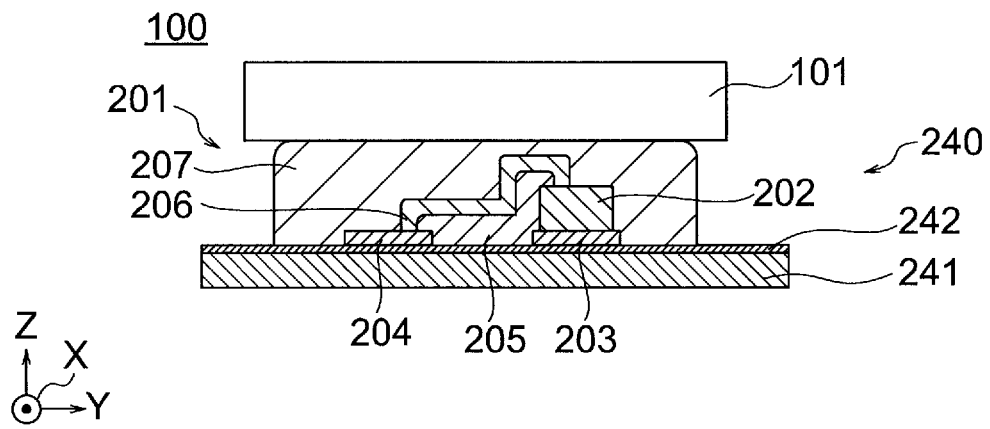
FIGS. 11A and 11B are schematic cross-sectional views showing a manufacturing process (3) of the semiconductor element unit according to the second embodiment.

On the supply substrate 240 manufactured as above, similarly to the first embodiment, the semiconductor element units 201 are successively moved from the positions on the formation substrate 241 and the formation sacrificial layer 242 when manufacturing a semiconductor packaging circuit which will be described later. Specifically, as shown in FIG. 11A corresponding to FIG. 3D, manufacturing equipment 100 executes a step of sticking the surface of the second insulation part 207 of the semiconductor element unit 201 facing the +Z direction (upper surface) on the lower surface of the stamp 101. The manufacturing equipment 100 that executes this step may be either the same as or different from the manufacturing equipment 100 that manufactured the semiconductor element unit 201.

Figure 11B:
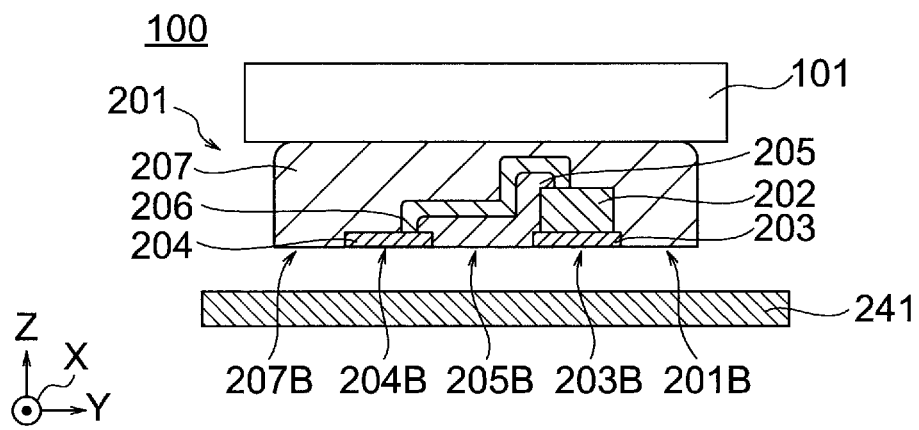

Subsequently, as shown in FIG. 11B corresponding to FIG. 3E, the manufacturing equipment 100 executes a step of removing the formation sacrificial layer 242 by means of an etching process using a solution of phosphoric acid or the like. By this step, the manufacturing equipment 100 puts the semiconductor element unit 201 in a state of having been stuck on the lower side of the stamp 101 and having been separated from the formation substrate 241. In this state, the manufacturing equipment 100 is capable of moving, i.e., supplying, the semiconductor element unit 201 to a desired position by moving the stamp 101.

2-3. Configuration and Manufacture of Semiconductor Packaging Circuit

Figure 12:
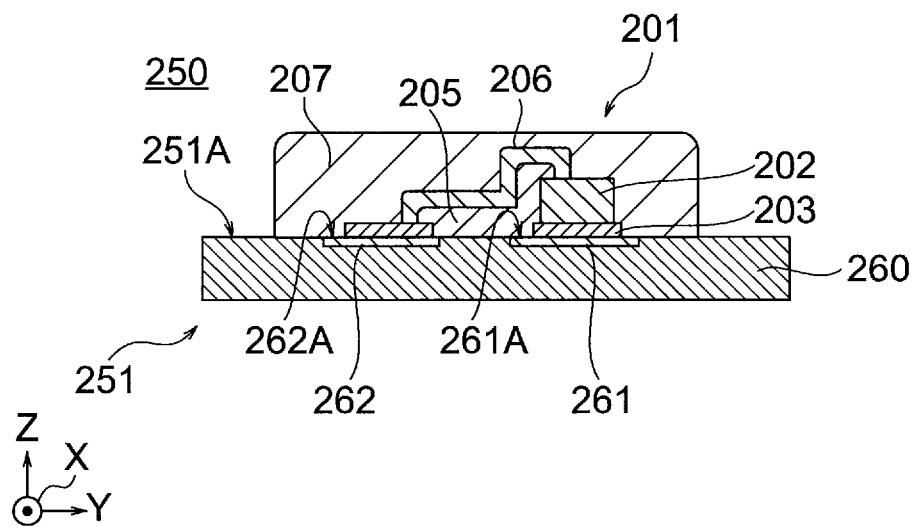
FIG. 12 is a schematic cross-sectional view showing the configuration of a semiconductor packaging circuit according to the second embodiment.

Next, a semiconductor packaging circuit 250 shown in FIG. 12 corresponding to FIG. 5 will be described below. FIG. 12 is a schematic cross-sectional view showing the configuration of the semiconductor packaging circuit 250 according to the second embodiment. The semiconductor packaging circuit 250 has a configuration in which the semiconductor element unit 201 is mounted on a circuit board 251.

The circuit board 251 is configured similarly to the circuit board 51 according to the first embodiment (FIG. 5) and includes a base member part 260, a first circuit connection pad 261 and a second circuit connection pad 262 respectively corresponding to the base member part 60, the first circuit connection pad 61 and the second circuit connection pad 62. In the following description, surfaces of the first circuit connection pad 261 and the second circuit connection pad 262 facing the +Z direction will be referred to as a first pad surface 261A and a second pad surface 262A, respectively.

On the circuit board 251, a substrate surface 251A as the surface facing the +Z direction is formed in an extremely flat planar shape similarly to the first embodiment. Namely, on the circuit board 251, the surface of the base member part 260, the first pad surface 261A and the second pad surface 262A are all extremely flat, are planes parallel to each other, and the distance between each other in regard to the Z direction (i.e., level difference) is also extremely small.

The semiconductor packaging circuit 250 is manufactured by manufacturing equipment 100 according to various manufacturing processes similar to those for manufacturing generic semiconductors, for example. The manufacturing equipment 100 that manufactures the semiconductor packaging circuit 250 may be either the same as or different from the manufacturing equipment 100 that manufactured the semiconductor element unit 201.

First, similarly to the case shown in FIG. 6A, the manufacturing equipment 100 manufactures the circuit board 251 to a state in which the first pad surface 261A and the second pad surface 262A are exposed to the surface of the base member part 260. For example, the manufacturing equipment 100 brings the circuit board 251 to a state in which the substrate surface 251A is extremely flat by executing processing like chemical mechanical polishing, for example, similarly to the first embodiment.

Specifically, on the circuit board 251, the surface roughness of the substrate surface 251A, namely, the surface roughness (roughness) at the base member part 260, the first pad surface 261A and the second pad surface 262A, is less than or equal to 10 [nm] similarly to the first embodiment.

Further, on the circuit board 251, the distances in regard to the Z direction (i.e., level difference heights) between the surface of the base member part 260 and the first pad surface 261A and between the surface of the base member part 260 and the second pad surface 262A are extremely small similarly to the first embodiment. Specifically, this level difference height (i.e., permissible level difference height) is less than or equal to $1/1000$ in comparison with the shorter one of the length LX of the side in the X direction and the length LY of the side in the Y direction in the semiconductor element unit 201 (FIG. 8A).

Subsequently, similarly to the case shown in FIG. 6B, the manufacturing equipment 100 executes a step of transferring the semiconductor element unit 201 stuck on the stamp 101 onto the substrate surface 251A of the circuit board 251.

Specifically, first, the manufacturing equipment 100 moves the stamp 101, on which one semiconductor element unit 201 has been stuck, to a position on the +Z direction side of a part of the circuit board 251 on which no other semiconductor element unit 201 has been stuck yet. At that time, the manufacturing equipment 100 executes positioning of the stamp 101 in regard to the X direction and the Y direction so that the whole range of the first electrode 203 of the semiconductor element unit 201 faces the first pad surface 261A and the whole range of the second electrode 204 faces the second pad surface 262A.

Subsequently, the manufacturing equipment 100 moves the stamp 101 in the −Z direction (i.e., downward) and thereby makes the unit mounting surface 201B of the semiconductor element unit 201 contact the substrate surface 251A of the circuit board 251. Specifically, the semiconductor element unit 201 has its first electrode mounting surface 203B contact the first pad surface 261A, has its second electrode mounting surface 204B contact the second pad surface 262A, and has its first insulation part mounting surface 205B and second insulation part mounting surface 207B contact the surface of the base member part 260.

Further, the manufacturing equipment 100 makes the stamp 101 apply prescribed pressure in the −Z direction (i.e., downward direction) to (press against) the semiconductor element unit 201. By this operation, the intermolecular force is made to act between the unit mounting surface 201B and the substrate surface 251A and the semiconductor element unit 201 is stuck on the circuit board 251 by the intermolecular force.

At that time, the first electrode mounting surface 203B is electrically connected to the first pad surface 261A by the bonding by the intermolecular force. Further, the second electrode mounting surface 204B is electrically connected to the second pad surface 262A by the bonding by the intermolecular force. Namely, the first electrode 203 and the second electrode 204 are electrically connected respectively to the first circuit connection pad 261 and the second circuit connection pad 262. Accordingly, in the semiconductor packaging circuit 250, it is possible to supply electric current from a drive circuit (not shown) of the circuit board 251 to the semiconductor element 202 of the semiconductor element unit 201 and thereby make the semiconductor element 202 emit light.

Further, in the semiconductor packaging circuit 250, although the semiconductor element unit 201 is bonded to the circuit board 251 by the intermolecular force, applying force stronger than the intermolecular force can cancel the bonding and easily peel off the semiconductor element unit 201 from the circuit board 251.

For example, the manufacturing equipment 100 makes a non-illustrated peeling head approach the semiconductor packaging circuit 250 and discharge a prescribed solvent and thereby lowers the bonding force of the semiconductor element unit 201. Subsequently, the manufacturing equipment 100 can peel off and remove the semiconductor element unit 201 from the circuit board 251 by moving the stamp 101 to the semiconductor element unit 201, making the stamp 101 suck the semiconductor element unit 201, and moving the stamp 101. At that time, the circuit board 251 is hardly damaged, and when another semiconductor element unit 201 is subsequently transferred thereto, the circuit board 251 is capable of bonding to the semiconductor element unit 201 by the intermolecular force.

Incidentally, similarly to the first embodiment, the semiconductor packaging circuit 250 is manufactured as a part of the LED display device 70 (FIG. 7), for example. In this case, the display circuit board 71D as a part of the LED display type display unit 71 has a configuration like a plurality of circuit boards 251 arrayed in a grid, for example. On the display circuit board 71D, the first circuit connection pad 261 and the second circuit connection pad 262 have been provided in each part corresponding to each circuit board 251, and each mounting part as a part on which each semiconductor element unit 201 should be mounted has been set.

When manufacturing the LED display device 70, the manufacturing equipment 100 successively mounts a plurality of semiconductor element units 201 on the aforementioned display circuit board 71D. In the LED display device 70, one semiconductor element unit 201 corresponds to one pixel. Thus, some millions of semiconductor element units 201, for example, are mounted on the display circuit board 71D depending on the resolution of the display circuit board 71D.

However, the semiconductor element unit 201 has a possibility of occurrence of a defective product due to a problem in the manufacture or the like. Then, when a part of the semiconductor element units 201 mounted on the LED display device 70 are defective products, for example, the LED display device 70 is necessitated to have a failure such as some pixels incapable of displaying normally, is judged to be defective in a test before shipment or the like, and can be discarded without being shipped.

Therefore, the manufacturing equipment 100 can test whether each semiconductor element unit 201 mounted on the display circuit board 71D operates normally or not and replace the semiconductor element unit 201 with a new semiconductor element unit 201 when the semiconductor element unit 201 is defective.

Figure 13:
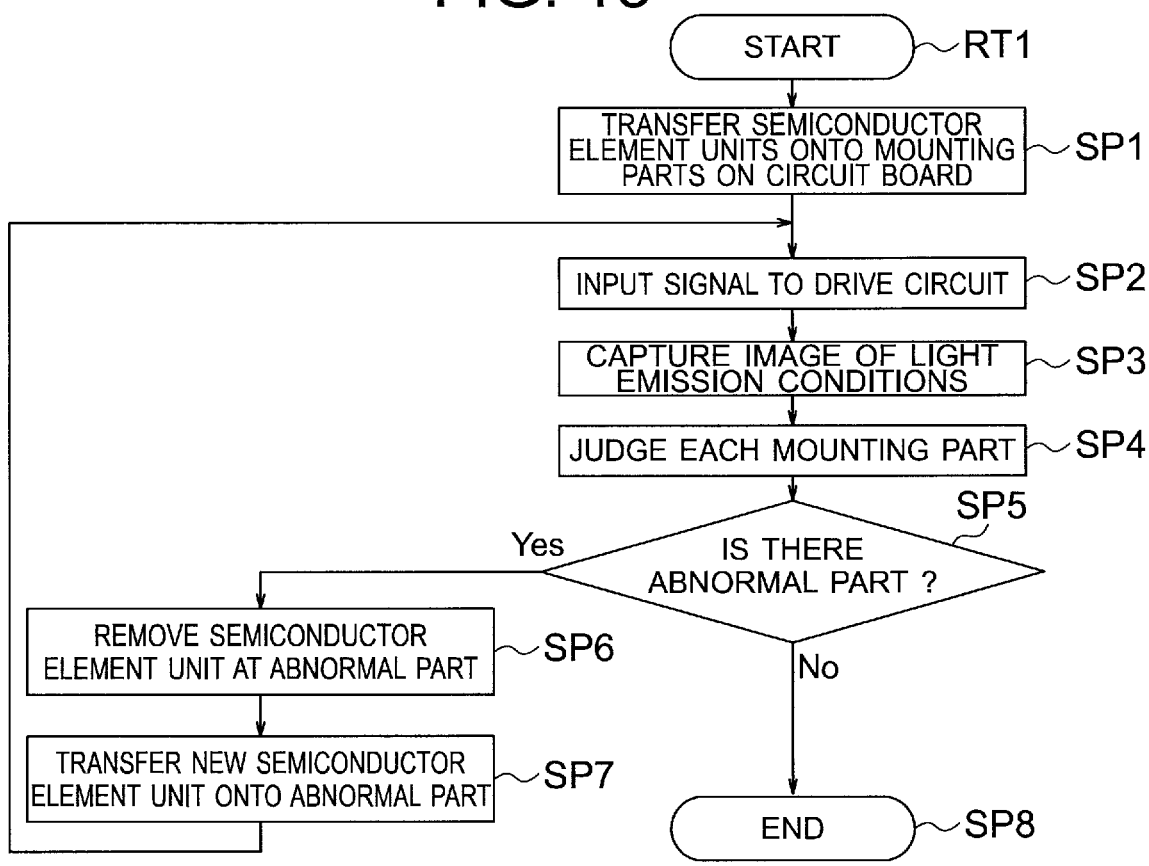
FIG. 13 is a flowchart showing a manufacturing process of the semiconductor packaging circuit.

FIG. 13 is a flowchart showing a manufacturing process of the semiconductor packaging circuit 250. The manufacturing equipment 100 executes the manufacturing process RT1 shown in FIG. 13 when mounting a plurality of semiconductor element units 201 on the display circuit board 71D. Upon starting the manufacturing process RT1, the manufacturing equipment 100 shifts to the first step SP1, makes the stamp 101 (FIGS. 11A and 11B) successively transfer the semiconductor element units 201 onto the mounting parts on the display circuit board 71D, and shifts to the next step SP2. This brings the display circuit board 71D to a state in which the semiconductor element units 201 are bonded to the mounting parts by the intermolecular force and the display circuit board 71D is connected to the semiconductor element units 201 also electrically.

In the step SP2, the manufacturing equipment 100 makes the semiconductor element units 201 at the mounting parts respectively emit light by supplying a prescribed signal to a drive circuit provided on the display circuit board 71D, and shifts to the next step SP3.

In the step SP3, the manufacturing equipment 100 makes a prescribed image capturing unit capture an image of light emission conditions of the semiconductor element units 201 at the mounting parts and generates a test image by performing prescribed image processing on the captured image, and shifts to the next step SP4. In cases where all the mounting parts on the display circuit board 71D cannot be accommodated in one test image due to restriction on the image capturing unit such as the resolution, the manufacturing equipment 100 divides the display circuit board 71D into a plurality of regions and generates the test image in regard to each of the regions.

In the step SP4, the manufacturing equipment 100 judges based on the test image whether each mounting part is a normal part where the mounted semiconductor element unit 201 is emitting light normally or an abnormal part where the mounted semiconductor element unit 201 is not emitting light normally, and shifts to the next step SP5. In short, the manufacturing equipment 100 checks the light emission condition of each semiconductor element unit 201 mounted on the display circuit board 71D by using the test image.

In the step SP5, the manufacturing equipment 100 judges whether or not there is at least one abnormal part on the display circuit board 71D. When an affirmative result is obtained in the judgment, it means that a normal LED display device 70 cannot be manufactured by using the display circuit board 71D since at least one of the plurality of semiconductor element units 201 mounted on the display circuit board 71D is not emitting light normally. Further, it means that the mounting part can be changed to a normal part if the semiconductor element unit 201 at the mounting part as the abnormal part is replaced and the semiconductor element unit 201 after the replacement emits light normally. Accordingly, the manufacturing equipment 100 shifts to the next step SP6.

In the step SP6, the manufacturing equipment 100 makes the non-illustrated peeling head discharge a prescribed solvent towards the abnormal part and thereby lowers the bonding force of the semiconductor element unit 201 at the abnormal part, removes the semiconductor element unit 201 from the abnormal part by using the stamp 101, and shifts to the next step SP7. When there are a plurality of abnormal parts, the manufacturing equipment 100 removes all of the semiconductor element units 201 at the abnormal parts.

In the step SP7, the manufacturing equipment 100 makes the stamp 101 transfer a new semiconductor element unit 201 onto the abnormal part and thereby has the new semiconductor element unit 201 bonded to the display circuit board 71D by the intermolecular force. Thereafter, the manufacturing equipment 100 judges whether the mounting part that was abnormal has changed to operate normally or not by returning to the step SP2 and repeating the series of processes.

In contrast, when a negative result is obtained in the step SP5, it means that the mounted semiconductor element units 201 are operating normally at all of the mounting parts on the display circuit board 71D, that is, the LED display type display unit 71 with all the pixels operating normally is completed. In this case, the manufacturing equipment 100 shifts to the next step SP8 and ends the manufacturing process RT1.

2-4. Effect and Other Features

In the above-described configuration, the semiconductor element unit 201 according to the second embodiment is formed so that the surface of the semiconductor element 202 facing the −Z direction and the surface of the first electrode 203 facing the +Z direction are connected to each other by eutectic bonding, the semiconductor element 202 and the second electrode 204 are connected to each other by the wiring part 206, and the unit mounting surface 201B is extremely flat (FIG. 8B).

Specifically, similarly to the first embodiment, the manufacturing equipment 100 manufacturing the semiconductor element unit 201 forms the first electrode 203 and the second electrode 204 like thin films on the +Z direction side (upper side) of the formation sacrificial layer 242 (FIGS. 10B and 10C) in the state of having been formed on the formation substrate 241. Subsequently, the manufacturing equipment 100 transfers the semiconductor element 202 manufactured separately (FIGS. 9A to 9D) onto the +Z direction side of the first electrode 203 (FIG. 10D) and executes the annealing process in this state.

In this case, the manufacturing equipment 100 executes the annealing process while leaving the first electrode mounting surface 203B and the second electrode mounting surface 204B in the state of being in contact with the formation sacrificial layer 242, by which the first electrode 203 and the semiconductor element 202 can be connected to each other by eutectic bonding while maintaining the extremely flat state of the first electrode mounting surface 203B and the second electrode mounting surface 204B without roughening the first electrode mounting surface 203B and the second electrode mounting surface 204B.

Further, the manufacturing equipment 100 forms the first insulation part 205 and the second insulation part 207 on the formation sacrificial layer 242 (FIGS. 10E and 10G). Therefore, the manufacturing equipment 100 can form the first insulation part mounting surface 205B and the second insulation part mounting surface 207B extremely flat, hold down the level differences relative to the first electrode mounting surface 203B and the second electrode mounting surface 204B to be extremely small, and finish the whole of the unit mounting surface 201B of the semiconductor element unit 201 extremely flat.

When the semiconductor element unit 201 manufactured as above is transferred onto the circuit board 251 (FIG. 12) so that the unit mounting surface 201B is in contact with the substrate surface 251A of the circuit board 251, the intermolecular force acts between the unit mounting surface 201B and the substrate surface 251A and the semiconductor element unit 201 can be bonded to the circuit board 251 with sufficient strength. Further, the semiconductor element unit 201 is capable of having the first electrode 203 and the second electrode 204 electrically connected respectively to the first circuit connection pad 261 and the second circuit connection pad 262.

Therefore, when the LED display type display unit 71 (FIG. 7) is manufactured by the manufacturing equipment 100, for example, the semiconductor element units 201 can be physically joined and electrically connected to the display circuit board 71D, that is, mounted on the display circuit board 71D, just by transferring the semiconductor element units 201 onto the plurality of mounting parts provided on the display circuit board 71D.

Accordingly, the manufacturing equipment 100 can check whether or not each of the mounted semiconductor element units 201 emits light normally or not by supplying current thereto, and when there is an abnormal part not emitting light normally, the manufacturing equipment 100 can easily peel off and replace the semiconductor element unit 201 practically without damaging the display circuit board 71D. Consequently, the manufacturing equipment 100 can remarkably increase the ratio of non-defective products, namely, the so-called manufacturing yield, in regard to the LED display type display unit 71 and the LED display device 70.

With the above-described configuration, in the manufacture of the semiconductor element unit 201 according to the second embodiment, the semiconductor element 202 and the first electrode 203 are connected to each other by eutectic bonding and the unit mounting surface 201B including the first electrode mounting surface 203B and the second electrode mounting surface 204B is formed to be in the extremely flat state. Accordingly, in the manufacture of the semiconductor packaging circuit 250, just by transferring the semiconductor element unit 201 onto the circuit board 251, the unit mounting surface 201B and the substrate surface 251A can be bonded to each other by the intermolecular force, the test of the light emission condition can be executed in this state, and the replacement work at the abnormal part can be executed with ease.

3. Third Embodiment

Figure 14A:
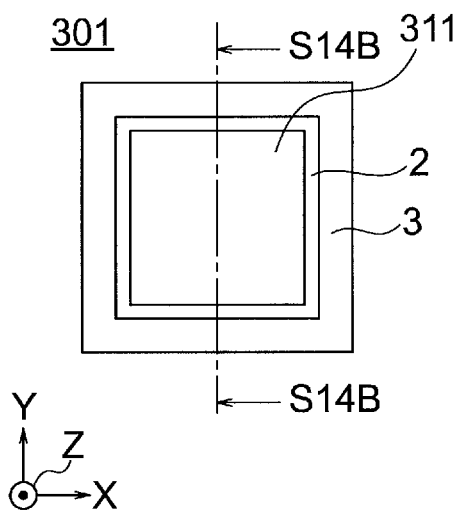
FIGS. 14A and 14B are a schematic plan view and a schematic cross-sectional view showing the configuration of a semiconductor element unit according to a third embodiment.
Figure 14B:
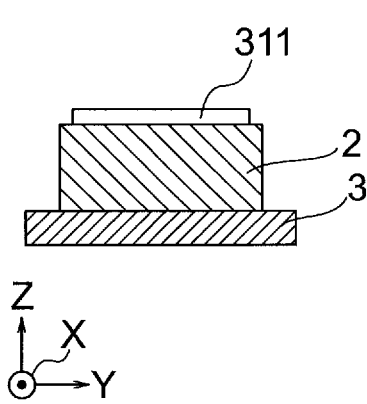

FIGS. 14A and 14B are a schematic plan view and a schematic cross-sectional view showing the configuration of a semiconductor element unit 301 according to a third embodiment. In the first embodiment described earlier, the description is given of the case where only the first electrode 3 is joined to the semiconductor element 2 of the semiconductor element unit 1 (FIGS. 1A and 1B). However, as in the semiconductor element unit 301 shown in FIGS. 14A and 14B, a direct top electrode 311 may be provided on the surface of the semiconductor element 2 facing the +Z direction, that is, the upper surface different from a joint surface joined to the first electrode 3. When manufacturing the semiconductor element unit 301, the manufacturing equipment 100 transfers the semiconductor element 2 onto the upper side of the first electrode 3 as shown in FIG. 3C, thereafter forms the direct top electrode 311 on the surface of the semiconductor element 2 facing the +Z direction (i.e., the upper surface) by a method such as vapor deposition, and thereafter executes the annealing process, for example. Accordingly, the semiconductor element unit 301 is capable of forming the eutectic bonding between the semiconductor element 2 and the first electrode 3 and between the semiconductor element 2 and the direct top electrode 311 as well. Further, in this case, the light emitted by the light emission by the semiconductor element 2 can be efficiently transmitted in the +Z direction by forming the direct top electrode 311 with a material having high light permeability as a so-called transparent electrode, for example, Further, in the first embodiment described earlier, the description of the semiconductor packaging circuit 50 (FIG. 5) is given of the case where the first circuit connection pad 61 is formed to be larger (longer) than the first electrode 3 in regard to the X direction and the Y direction and the first electrode mounting surface 3B is mounted at a position to face the inside of the range of the first pad surface 61A. However, it is also possible, for example, to form the first electrode 3 to be larger (longer) than the first circuit connection pad 61 in regard to at least one of the X direction and the Y direction and mount a part of the first electrode mounting surface 3B at a position to face a part deviating from the range of the first pad surface 61A. In this case, on the circuit board 51, the substrate surface 51A is desired to be as flat as possible. Specifically, the size of the level difference, namely, the distance in regard to the Z direction, between the surface of the base member part 60 facing the +Z direction and the first pad surface 61A is desired to be less than or equal to 1/1000 of the lengths of the semiconductor element unit 301 in the X direction and the Y direction.

The same applies to the first electrode 203 and the second electrode 204 in the second embodiment. Namely, the level differences among the first electrode 203, the second electrode 204, the first insulation part 205 and the second insulation part 207 are also desired to be less than or equal to 1/1000 of the lengths of the semiconductor element unit 201 in the X direction and the Y direction.

Furthermore, in the first embodiment described earlier, the description is given of the case where the formation substrate 41 and the formation sacrificial layer 42 in the state in which the semiconductor element unit 1 has been set on the formation sacrificial layer 42 as shown in FIG. 3C and FIGS. 4A and 4B are used as the supply substrate 40. However, it is also possible, for example, to use the semiconductor element unit 1 stuck on the lower surface of the stamp 101 as shown in FIG. 3E as the supply substrate, or to use the semiconductor element unit 1 transferred from the stamp 101 onto a prescribed substrate as the supply substrate. Further, in such cases, it is also possible, for example, to form different types of semiconductor element units 1 respectively on a plurality of substrates each made up of the formation substrate 41 and the formation sacrificial layer 42 by using a plurality of types of semiconductor elements 2 different from each other, transfer a plurality of types of semiconductor element units 1 onto one substrate as a mixture of the plurality of types of semiconductor element units 1, and use the substrate in this state as the supply substrate. The same applies to the second embodiment. Namely, the semiconductor element units 201 may be used instead of the semiconductor element units 1.

Moreover, in the first embodiment described earlier, the description is given of the case where a plurality of semiconductor elements 2 of the same type are respectively transferred onto a plurality of first electrodes 3 (FIG. 3C and FIGS. 4A and 4B) when manufacturing a plurality of semiconductor element units 1 in an array on the supply substrate 40. However, it is also possible, for example, to form the supply substrate 40 by respectively transferring a plurality of semiconductor elements 2, as a mixture of a plurality of types, onto a plurality of first electrodes 3. Further, similarly to aforementioned cases, it is also possible to use semiconductor element units 1 (i.e., those including a mixture of a plurality of types of semiconductor elements 2) stuck on the lower surface of the stamp 101 as the supply substrate, or to use semiconductor element units 1 transferred onto a prescribed substrate as the supply substrate. The same applies to the second embodiment. Namely, a plurality of semiconductor element units 201 transferred onto a prescribed substrate may be used as the supply substrate.

In addition, in the first embodiment described earlier, the description is given of the case where one type of semiconductor element units 1 are mounted on the display circuit board 71D of the LED display type display unit 71 when manufacturing the LED display device 70 (FIG. 7). However, it is also possible to mount a plurality of types of semiconductor element units 1 on the display circuit board 71D. Specifically, an LED display type display unit 71 capable of performing color display can be implemented by, for example, mounting red semiconductor element units 1 employing semiconductor elements 2 emitting red light, green semiconductor element units 1 employing semiconductor elements 2 emitting green light, and blue semiconductor element units 1 employing semiconductor elements 2 emitting blue light on the display circuit board 71D so that red, green and blue semiconductor element units 1 are arranged repeatedly. The same applies to the second embodiment. Namely, an LED display type display unit 71 capable of performing color display can be implemented by mounting red semiconductor element units 201, green semiconductor element units 201 and blue semiconductor element units 201 on the display circuit board 71D so that red, green and blue semiconductor element units 201 are arranged regularly.

4. Fourth Embodiment

Figure 15A:
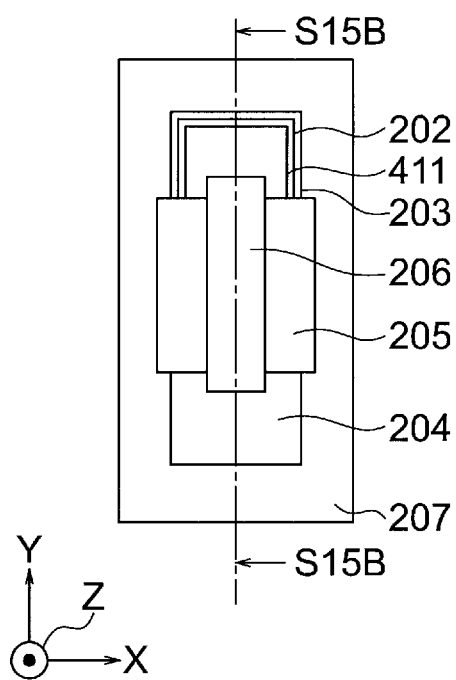
FIGS. 15A and 15B are a schematic plan view and a schematic cross-sectional view showing the configuration of a semiconductor element unit according to a fourth embodiment.
Figure 15B:
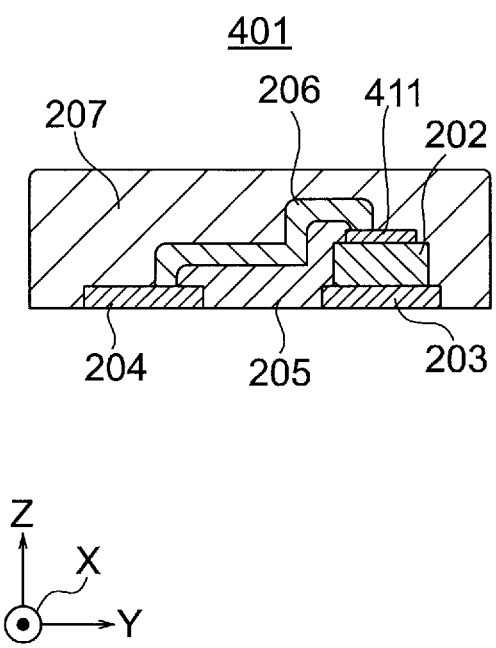

FIGS. 15A and 15B are a schematic plan view and a schematic cross-sectional view showing the configuration of a semiconductor element unit 401 according to a fourth embodiment. In the second embodiment described earlier, the description is given of the case where only the first electrode 203 is joined to the semiconductor element 202 of the semiconductor element unit 201 (FIGS. 8A and 8B). However, as in the semiconductor element unit 401 shown in FIGS. 15A and 15B, a direct top electrode 411 may be provided on the surface of the semiconductor element 202 facing the +Z direction, that is, the upper surface on the side opposite to the surface joined to the first electrode 203. When manufacturing the semiconductor element unit 401, the manufacturing equipment 100 transfers the semiconductor element 202 onto the upper side of the first electrode 203 as shown in FIG. 10D, thereafter forms the direct top electrode 411 on the surface of the semiconductor element 202 facing the +Z direction (i.e., the upper surface) by a method such as vapor deposition, and thereafter executes the annealing process, for example. Accordingly, the semiconductor element unit 401 is capable of forming the eutectic bonding between the semiconductor element 202 and the first electrode 203 and between the semiconductor element 202 and the direct top electrode 411 as well. Further, in this case, the light emitted by the light emission by the semiconductor element 202 can be efficiently transmitted in the +Z direction by forming the direct top electrode 411 with a material having high light permeability as a so-called transparent electrode, for example,

5. Fifth Embodiment

Figure 16A:
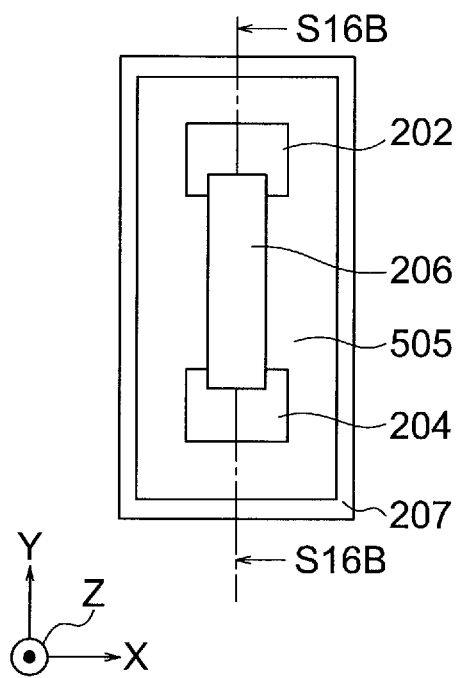
FIGS. 16A and 16B are a schematic plan view and a schematic cross-sectional view showing the configuration of a semiconductor element unit according to a fifth embodiment.
Figure 16B:
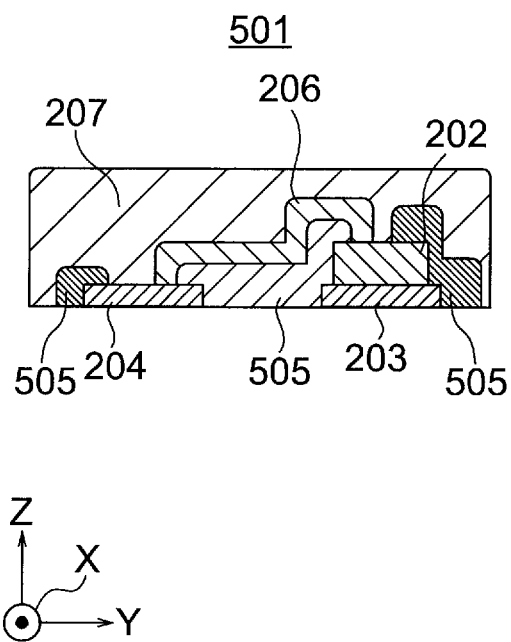

FIGS. 16A and 16B are a schematic plan view and a schematic cross-sectional view showing the configuration of a semiconductor element unit 501 according to a fifth embodiment. In the second embodiment described earlier, the description is given of the case where the first insulation part 205 of the semiconductor element unit 201 (FIGS. 8A and 8B) is provided in a range in regard to the Y direction extending from a part of the surface of the semiconductor element 202 facing the +Z direction (upper surface) to a part of the surface of the second electrode 204 facing the +Z direction (upper surface). However, as in the semiconductor element unit 501 shown in FIGS. 16A and 16B, it is also possible to provide a first insulation part 505 in a wider range in regard to the Y direction, such as a range extending from a position on the +Y direction side of the semiconductor element 202 to a position on the −Y direction side of the second electrode 204. In this case, it is desirable to leave a part of the surface of the semiconductor element 202 facing the +Z direction and a part of the surface of the second electrode 204 facing the +Z direction in the state of being exposed so that the wiring part 206 can be electrically connected to the semiconductor element 202 and the second electrode 204. The first insulation part 55 of the semiconductor packaging circuit 50 (FIG. 5) in the first embodiment can also employ structure similar to the first insulation part 505 shown in FIGS. 16A and 16B.

6. Sixth Embodiment

Figure 17A:
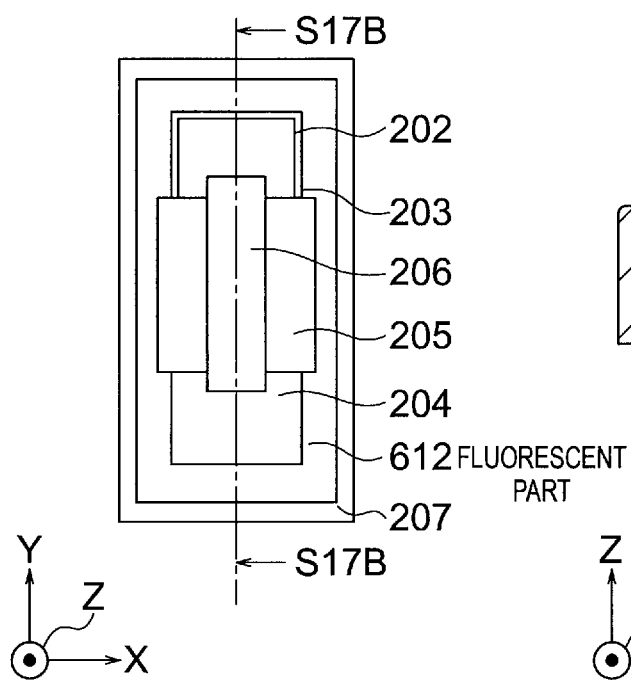
FIGS. 17A and 17B are a schematic plan view and a schematic cross-sectional view showing the configuration of a semiconductor element unit according to a sixth embodiment.
Figure 17B:
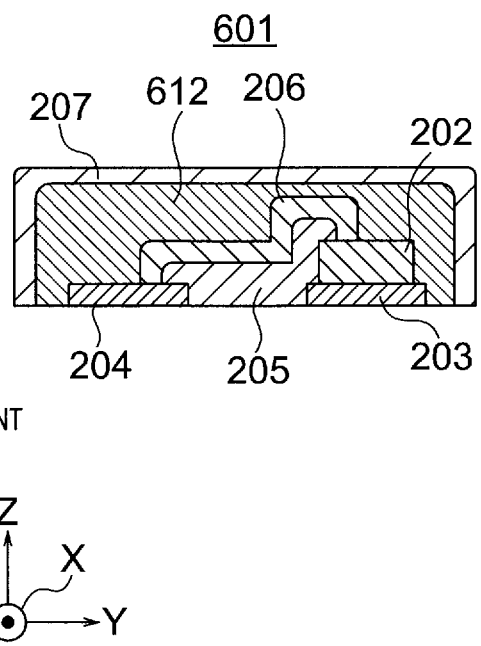

FIGS. 17A and 17B are a schematic plan view and a schematic cross-sectional view showing the configuration of a semiconductor element unit according to a sixth embodiment. In the second embodiment described earlier, the description is given of the case where the second insulation part 207 is provided to be overlaid directly on the +Z direction side (upper side) of the first insulation part 205 and the wiring part 206 in the semiconductor element unit 201 (FIGS. 8A and 8B). However, as in a semiconductor element unit 601 shown in FIGS. 17A and 17B, it is also possible to provide one or more films or layers made of a different material, such as a fluorescent part 612, on the +Z direction side (upper side) of the first insulation part 205 and the wiring part 206 and provide the second insulation part 207 on the +Z direction side (upper side) of the one or more films or layers. When manufacturing the semiconductor element unit 401, the manufacturing equipment 100 may provide the wiring part 206 so as to overlay it on the first insulation part 205 as shown in FIG. 10F, thereafter provide the fluorescent part 612 so as to overlay it on the wiring part 206, and thereafter provide the second insulation part 207 as shown in FIG. 17B, for example. Incidentally, it is permissible if the fluorescent part 612 covers at least the semiconductor element 202 even if parts of the first insulation part 205 and the wiring part 206 are exposed. When making the semiconductor element 202 emit light, the semiconductor element unit 601 is capable of converting the color of the emitted light to a different color by using the fluorescent part 612. The semiconductor packaging circuit 50 in the first embodiment can also be provided with the fluorescent part in a similar manner.

7. Other Embodiments

Figure 18:
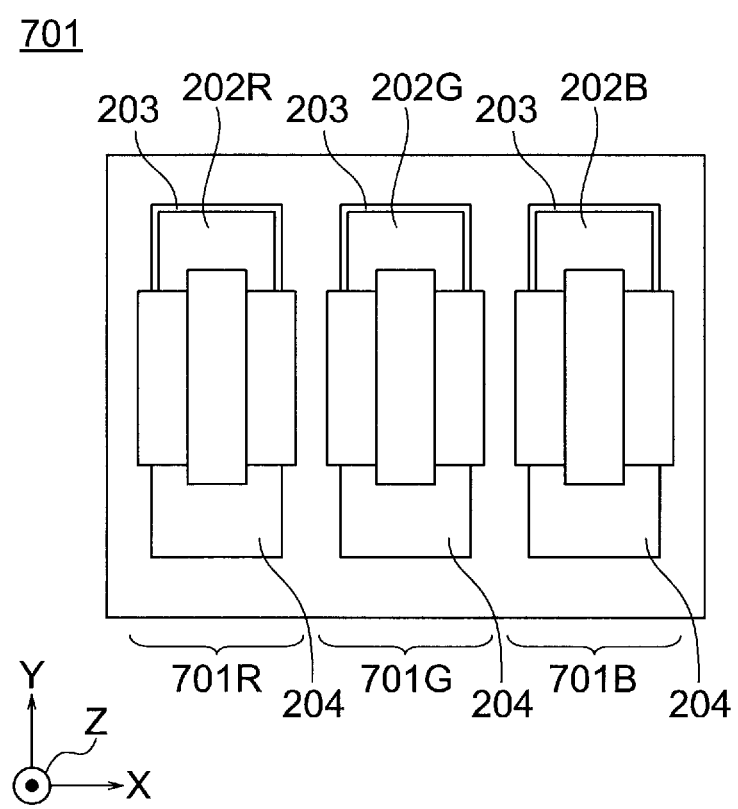
FIG. 18 is a schematic plan view showing the configuration of a semiconductor element unit according to another embodiment.

FIG. 18 is a schematic plan view showing the configuration of a semiconductor element unit according to another embodiment. In the second embodiment described earlier, the description is given of the case where the semiconductor element unit 201 is provided with one semiconductor element 202, one first electrode 203, one second electrode 204, one first insulation part 205 and one wiring part 206. However, it is also possible to provide one semiconductor element unit with a plurality of components such as semiconductor elements 202. For example, as in a semiconductor element unit 701 shown in FIG. 18, the semiconductor element unit may be configured to arrange three semiconductor element units 701R, 701G and 701B in the X direction. In this case, the semiconductor element unit 701 can be used as a display element for each pixel in a color display device by forming the semiconductor element 202R as a red light-emitting element, forming the semiconductor element 202G as a green light-emitting element and forming the semiconductor element 202B as a blue light-emitting element, for example.

Figure 19:
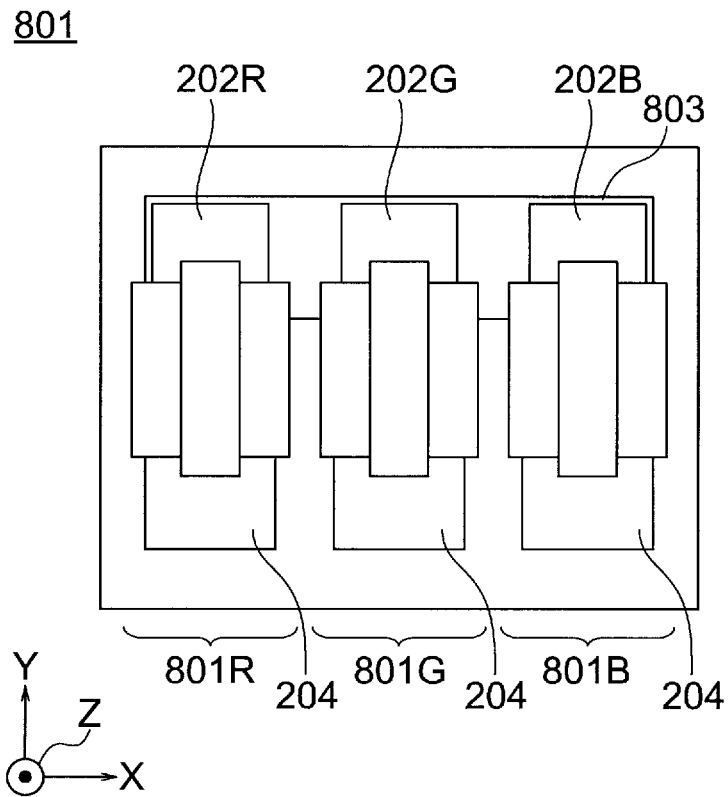
FIG. 19 is a schematic plan view showing the configuration of a semiconductor element unit according to another embodiment.

FIG. 19 is a schematic plan view showing the configuration of a semiconductor element unit according to another embodiment. As in a semiconductor element unit 801 shown in FIG. 19, instead of the first electrode 203 in each semiconductor element unit 801R, 801G, 801B for each color, a common first electrode 803 configured like those three first electrodes 203 connected together in the X direction may be provided.

Figure 20:
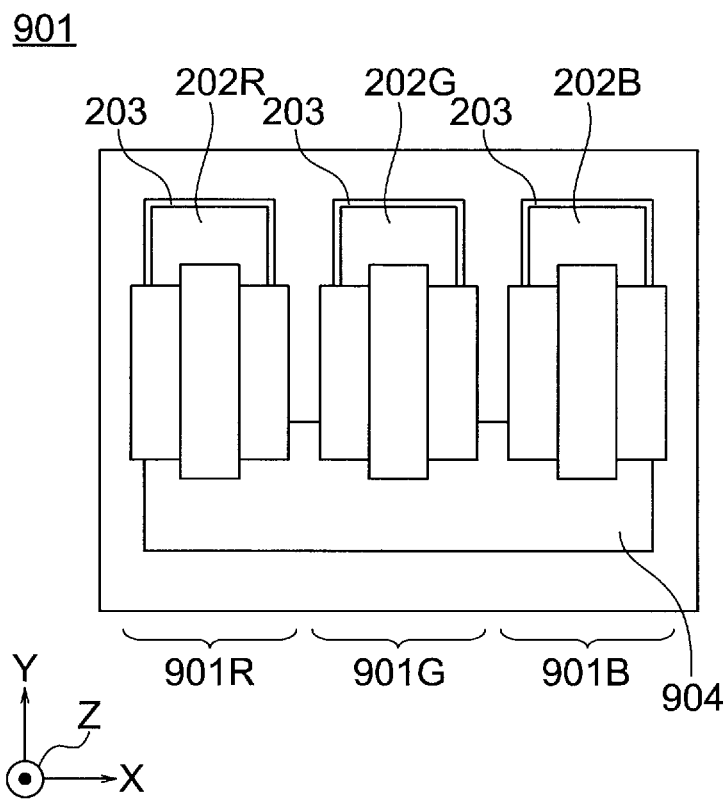
FIG. 20 is a schematic plan view showing the configuration of a semiconductor element unit according to another embodiment.

FIG. 20 is a schematic plan view showing the configuration of a semiconductor element unit according to another embodiment. As in a semiconductor element unit 901 shown in FIG. 20, instead of the second electrode 204 in each semiconductor element unit 901R, 901G, 901B for each color, a common second electrode 904 configured like those three second electrodes 204 connected together in the X direction may be provided.

Further, in the second embodiment described earlier, the description is given of the case where the second electrode 204 is formed after forming the first electrode 203 on the formation sacrificial layer 242 (FIGS. 10B and 10C) in the manufacture of the semiconductor element unit 201 by the manufacturing equipment 100. However, it is also possible, for example, to form the first electrode 203 after forming the second electrode 204, or to form the first electrode 203 and the second electrode 204 at the same time in cases where both electrodes are made of the same material. Alternatively, it is also possible, for example, to form the first electrode 203, transfer the semiconductor element 202 onto the upper side of the first electrode 203, execute the annealing process, and thereafter form the second electrode 204.

Furthermore, in the second embodiment described earlier, the description is given of the case where the LED display type display unit 71 is considered to have been completed and the manufacturing process RT1 is ended when the negative result is obtained, that is, no abnormal part is found, in the step SP5 of the manufacturing process RT1 (FIG. 13). However, when the negative result is obtained in the step SP5, it is also possible, for example, to make the manufacturing equipment 100 apply at least either prescribed pressure or prescribed heat to the display circuit board 71D on which each semiconductor element unit 201 has been bound to each mounting part by the intermolecular force. By this operation, ohmic connection can be realized between the first electrode 203 and the first circuit connection pad 261 and between the second electrode 204 and the second circuit connection pad 262 by the eutectic bonding, and the electrical connection between the electrodes and the connection pads can be stabilized. Put another way, in the LED display type display unit 71, the state in which the electrodes and the connection pads are joined to each other just by the intermolecular force can be regarded as a state of "provisional fixation" in which the electrodes and the connection pads are electrically connected to each other and fixed to each other by relatively weak force allowing for easy replacement, and the state in which the eutectic bonding has been formed can be regarded as a state of "full fixation" in which the electrodes and the connection pads are firmly fixed to each other by relatively strong force at a level of preventing easy peeling.

Moreover, in the second embodiment described earlier, the description is given of the case where the semiconductor element unit 201 is peeled off from the display circuit board 71D after weakening the bonding by the intermolecular force by discharging a prescribed solvent towards the abnormal part in the step SP6 of the manufacturing process RT1 (FIG. 13). However, it is also possible, for example, to peel off the semiconductor element unit 201 from the display circuit board 71D after weakening the bonding by the intermolecular force by a different method, or without weakening the bonding by the intermolecular force.

In the first embodiment described earlier, the description is given of the case where the LED display device 70 (FIG. 7) is formed by mounting the semiconductor element units 1, each including the semiconductor element 2 formed of a light-emitting element, on the display circuit board 71D formed of a glass epoxy substrate. However, it is also possible, for example, to form a flexible display by mounting a plurality of semiconductor element units 1 on a flexible circuit board.

Further, in the present disclosure, it is also possible to mount the semiconductor element unit 1, including a semiconductor element 2 formed of an element of one of various types other than a light-emitting element such as a sensor element for detecting one of various physical quantities, on a prescribed circuit board. For example, an optical sensor array may be formed by forming the semiconductor element unit 1 by using a semiconductor element 2 formed of a light receiving element and mounting a plurality of the semiconductor element units 1 on a prescribed circuit board.

It is also possible, for example, to form an image sensor by forming the semiconductor element 2 as a p-n junction photodiode and mounting a plurality of semiconductor element units 1, each including the semiconductor element 2, in an array on a prescribed circuit board. As above, various types of electronic devices can be formed by forming the semiconductor element unit 1 by using a semiconductor element 2 formed of an element having one of various functions and mounting a plurality of the semiconductor element units 1 on a prescribed circuit board. The same applies to the second embodiment.

The present invention is not limited to the examples described above. Namely, the present invention is applicable also to modes obtained by arbitrarily combining parts or wholes of some of the above-described embodiments and modes obtained by extracting parts from the above-described embodiments.

Further, in the embodiments described earlier, the description is given of the case where the semiconductor element unit (e.g., 1) is formed with the semiconductor element (e.g., 2) and the first electrode (e.g., 3). However, it is also possible to form the semiconductor element unit with a semiconductor element made in a variety of different configuration and the first electrode.

DESCRIPTION OF REFERENCE CHARACTERS 1, 201: semiconductor element unit, 1B, 201B: unit mounting surface, 2, 202: semiconductor element, 3, 203: first electrode, 3B, 203B: first electrode mounting surface, 31, 231: growth substrate, 32, 232: growth sacrificial layer, 33, 233: semiconductor functional layer, 40, 240: supply substrate, 41, 241: formation substrate, 42, 242: formation sacrificial layer, 50, 250: semiconductor packaging circuit, 51, 251: circuit board, 51A, 251A: substrate surface, 55: first insulation part, 56: wiring part, 60, 260: base member part, 61, 261: first circuit connection pad, 61A, 261A: first pad surface, 62, 262: second circuit connection pad, 62A, 262A: second pad surface, 70: LED display device, 71: LED display type display unit, 71D: display circuit board, 204: second electrode, 204B: second electrode mounting surface, 205: first insulation part, 205B: first insulation part mounting surface, 206: wiring part, 207: second insulation part, 207B: second insulation part mounting surface.

What is claimed is:
1. A semiconductor element unit comprising:
a semiconductor element;
a first electrode having a flat first electrode mounting surface and a bonding surface opposite to the first electrode mounting surface, a roughness of the first electrode mounting surface being less than or equal to 10 [nm], the bonding surface of the first electrode forming eutectic bonding with the semiconductor element, and being in ohmic contact with the semiconductor element;
a second electrode provided at a position not contacting the semiconductor element or the first electrode and having a flat second electrode mounting surface;
a first insulation part formed to straddle a part of the semiconductor element and a part of the second electrode, the first insulation part having a first insulation part mounting surface formed on a same side as the first electrode mounting surface and the second electrode mounting surface;
a wiring part formed to be overlaid on the first insulation part and electrically connecting another part of the semiconductor element not covered by the first insulation part and another part of the second electrode not covered by the first insulation part to each other; and
a second insulation part covering the semiconductor element, the wiring part, the first insulation part and the second electrode, the second insulation part having a second insulation part mounting surface formed on a same side as the first electrode mounting surface and the second electrode mounting surface, wherein
a unit mounting surface including the first electrode mounting surface, the second electrode mounting sur- face, the first insulation part mounting surface, and the second insulation part mounting surface forms a flat surface.

2. The semiconductor element unit according to claim 1, wherein
the first insulation part mounting surface is situated on the unit mounting surface, and
the second insulation part mounting surface is situated on the unit mounting surface.

3. The semiconductor element unit according to claim 1, wherein
the first insulation part covers side faces of the first electrode, the second electrode and the semiconductor element not parallel to the unit mounting surface.

4. The semiconductor element unit according to claim 1, further comprising:
a direct top electrode provided on a surface of the semiconductor element different from a joint surface where the eutectic bonding with the first electrode is formed, wherein
the first insulation part is formed to straddle at least a part of the direct top electrode and the part of the second electrode, and
the wiring part is overlaid on the first insulation part and electrically connects another part of the direct top electrode not covered by the first insulation part and said another part of the second electrode not covered by the first insulation part to each other.

5. The semiconductor element unit according to claim 1, further comprising:
a fluorescent part covering the semiconductor element, wherein
the second insulation part covers the wiring part, the first insulation part, the second electrode and the fluorescent part.

6. A semiconductor element unit supply substrate comprising:
one or more semiconductor element units according to claim 1; and
a substrate having a flat substrate surface, wherein
the one or more semiconductor element units are stuck on the substrate in a state of being in contact with the substrate surface.

7. A semiconductor packaging circuit comprising:
the semiconductor element unit according to claim 1;
a circuit board whose substrate surface is formed flat;
a first circuit connection pad provided on the circuit board and whose first pad surface being exposed to the substrate surface is in contact with the first electrode mounting surface of the semiconductor element unit; and
a second circuit connection pad provided on the circuit board and whose second pad surface being exposed to the substrate surface is in contact with the second electrode mounting surface of the semiconductor element unit.

8. The semiconductor element unit according to claim 1, wherein
the semiconductor element has a first surface and a second surface opposite to each other, the second surface forming the eutectic bonding with the bonding surface of the first electrode, and
the semiconductor element unit further includes a direct top electrode provided on the first surface thereof.

9. A semiconductor element unit supply substrate comprising:
one or more semiconductor element units according to claim 1; and
a substrate having a flat substrate surface, wherein
the one or more semiconductor element units are stuck on the substrate in a state of being in contact with the substrate surface.

10. A semiconductor packaging circuit comprising:
a semiconductor element unit, including:
a semiconductor element, and
a first electrode having a flat first electrode mounting surface and a bonding surface opposite to the first electrode mounting surface, a roughness of the first electrode mounting surface being less than or equal to 10 [nm], the bonding surface of the first electrode forming eutectic bonding with the semiconductor element, and being in ohmic contact with the semiconductor element;
a circuit board having a substrate surface that is formed flat;
a first circuit connection pad provided on the circuit board, and having a first pad surface that is exposed to the substrate surface and is in contact with the first electrode mounting surface of the semiconductor element unit;
a second circuit connection pad provided on the circuit board and having a second pad surface that is exposed to the substrate surface;
an insulation part formed on a region extending from a part of the semiconductor element to a part of the second circuit connection pad via the circuit board; and
a wiring part formed to be overlaid on the insulation part and electrically connecting another part of the semiconductor element not covered by the insulation part and the second circuit connection pad to each other.

11. A method of manufacturing a semiconductor packaging circuit, comprising:
providing
a circuit board having a substrate surface,
a first circuit connection pad provided on the circuit board and having a first pad surface that is exposed to the substrate surface, and
a second circuit connection pad provided on the circuit board and having a second pad surface that is exposed to the substrate surface;
transferring a semiconductor element unit having
a semiconductor element, and
a first electrode having a flat first electrode mounting surface and a bonding surface opposite to the first electrode mounting surface, a roughness of the first electrode mounting surface being less than or equal to 10 [nm], the bonding surface of the first electrode forming eutectic bonding with the semiconductor element, and being in ohmic contact with the semiconductor element onto the substrate surface of the circuit board and placing the first electrode mounting surface in contact with the first pad surface;
forming a first insulation part on a region extending from a part of the semiconductor element to a part of the second circuit connection pad via the circuit board; and
forming a wiring part that electrically connects another part of the semiconductor element not covered by the first insulation part and another part of the second circuit connection pad not covered by the first insulation part to each other so that the wiring part is overlaid on the first insulation part.

* * * * *